(12) United States Patent
Choksi et al.

(10) Patent No.: US 12,089,351 B2
(45) Date of Patent: Sep. 10, 2024

(54) PORTABLE POWER SUPPLY

(71) Applicant: BLACK & DECKER INC., New Britain, CT (US)

(72) Inventors: Snehal S. Choksi, Hampstead, MD (US); Geoffrey S. Howard, Columbia, MD (US); Daniel L. Schwarz, Timonium, MD (US); Thomas C. Kohler, Bel Air, MD (US); Keith Hopwood, Fremont, MD (US); Richard A. Sy, Fremont, CA (US); Chun-Te Chin, Union City, CA (US); Jiunping Huang, Tainan (TW); Minghuang Hung, Tainan (TW)

(73) Assignee: BLACK & DECKER INC., New Britain, CT (US)

( * ) Notice: Subject to any disclaimer, the term of this patent is extended or adjusted under 35 U.S.C. 154(b) by 802 days.

(21) Appl. No.: 16/884,568

(22) Filed: May 27, 2020

(65) Prior Publication Data

US 2020/0288588 A1   Sep. 10, 2020

Related U.S. Application Data

(63) Continuation of application No. 16/120,574, filed on Sep. 4, 2018, now Pat. No. 10,674,618.

(Continued)

(51) Int. Cl.
*H05K 5/00* (2006.01)
*H01M 10/42* (2006.01)
(Continued)

(52) U.S. Cl.
CPC ........ *H05K 5/0086* (2013.01); *H01M 10/425* (2013.01); *H01M 10/4257* (2013.01);
(Continued)

(58) Field of Classification Search
CPC ........... H01M 10/425; H01M 10/4257; H01M 2010/4271; H01M 2220/20; H01M 2220/30; H04B 3/54; H04B 14/06
(Continued)

(56) References Cited

U.S. PATENT DOCUMENTS

2016/0020443 A1* 1/2016 White ................. B25F 5/00
 318/245
2017/0063114 A1* 3/2017 Briere ................. H02J 7/0013
(Continued)

*Primary Examiner* — Rexford N Barnie
*Assistant Examiner* — Swarna N Chowdhuri
(74) *Attorney, Agent, or Firm* — Michael Aronoff

(57) ABSTRACT

A power supply apparatus is provided including a housing, at least one battery receptacle for receiving at least one removable battery pack, an inverter that converts a direct-current (DC) signal from the at least one battery pack to an alternating-current (AC) signal, and a controller that applies a pulse-width modulation (PWM) signal to the inverter to shape the AC signal with a lower harmonic distortion relative to a square wave. For each full cycle of the AC signal, the controller sets the duty cycle to approximately 100% within a first period corresponding to a peak area of the AC signal, to less than approximately 100% but greater than approximately 0% within a second period in which the AC signal transitions from the peak to a zero-cross following the first period, and to 0% within a third period corresponding to the zero-cross of the AC signal following the second period.

15 Claims, 21 Drawing Sheets

Related U.S. Application Data

(60) Provisional application No. 62/553,693, filed on Sep. 1, 2017.

(51) Int. Cl.

| | | |
|---|---|---|
| *H01M 10/613* | (2014.01) | |
| *H01M 10/6235* | (2014.01) | |
| *H01M 10/627* | (2014.01) | |
| *H01M 10/6551* | (2014.01) | |
| *H01M 10/6554* | (2014.01) | |
| *H01M 10/6563* | (2014.01) | |
| *H01M 50/244* | (2021.01) | |
| *H01M 50/247* | (2021.01) | |
| *H04B 3/54* | (2006.01) | |
| *H05K 1/02* | (2006.01) | |
| *H05K 7/14* | (2006.01) | |
| *H05K 7/20* | (2006.01) | |
| *H04B 14/02* | (2006.01) | |

(52) U.S. Cl.
CPC ..... *H01M 10/613* (2015.04); *H01M 10/6235* (2015.04); *H01M 10/627* (2015.04); *H01M 10/6551* (2015.04); *H01M 10/6554* (2015.04); *H01M 10/6563* (2015.04); *H01M 50/244* (2021.01); *H01M 50/247* (2021.01); *H04B 3/54* (2013.01); *H05K 1/0203* (2013.01); *H05K 7/1427* (2013.01); *H05K 7/20154* (2013.01); *H05K 7/20172* (2013.01); *H05K 7/20209* (2013.01); *H01M 2010/4271* (2013.01); *H01M 2220/20* (2013.01); *H01M 2220/30* (2013.01); *H04B 14/026* (2013.01)

(58) Field of Classification Search
USPC .......................................................... 307/5
See application file for complete search history.

(56) References Cited

U.S. PATENT DOCUMENTS

| | | | | |
|---|---|---|---|---|
| 2017/0346414 | A1* | 11/2017 | Mondal | H02M 7/53871 |
| 2018/0034268 | A1* | 2/2018 | Motsenbocker | H02J 1/06 |
| 2018/0290270 | A1* | 10/2018 | Manasseh | H02P 6/32 |
| 2018/0358817 | A1* | 12/2018 | Koyama | H01M 6/5044 |

* cited by examiner

PORTABLE POWER SUPPLY

RELATED APPLICATIONS

This application is a continuation of U.S. patent application Ser. No. 16/120,574 filed Apr. 24, 2020 titled "Portable Power Supply," which claims priority under 35 U.S.C. § 119(e) to U.S. Provisional Patent Application No. 62/553,693, filed Sep. 1, 2017, titled "Portable Power Supply."

This application is related to U.S. patent application Ser. No. 14/876,458 which is incorporated by reference in its entirety.

TECHNICAL FIELD

This application relates to a portable power supply system and method for providing portable power. In one implementation, the system is configured to receive DC power from a DC power source and AC power from an AC power source. The system is configured to output power from the DC power source and/or the AC power source.

BACKGROUND

Various types of electric power tools are commonly used in construction, home improvement, outdoor, and do-it-yourself projects. Conventional power tools generally fall into two categories—corded power tools that are powered by an AC power source, e.g., an AC mains line, and cordless power tools that are powered by one or more DC power sources, e.g., a rechargeable battery pack.

Corded power tools generally are used for heavy duty applications that require high power and/or long runtimes, such as heavy duty sawing, heavy duty drilling and hammering, and heavy duty metal working. However, as their name implies, corded power tools require the use of a cord that can be connected to an AC power source. In many applications, such as on construction sites, it is not convenient or practical to find a continuously available AC power source and/or AC power must be generated by a portable power supply such as a generator, e.g. gas powered generator.

Cordless power tools generally are used for lighter duty applications that require low or medium power and/or short runtimes, such as light duty sawing, light duty drilling, and fastening. As cordless tools tend to be more limited in their power and/or runtime, they have not generally been accepted by the industry for all applications. They are also limited by weight since the higher capacity batteries tend to have greater weight, creating an ergonomic disadvantage.

Generally, conventional power tool battery packs may not be able to run conventional corded power tools or other corded electrical devices, while untransformed AC power may not be able to be used to run cordless power tools. Further, the battery packs for cordless power tools may require frequent recharging, may be expensive to purchase, and may be cumbersome to manage on a large construction site.

There are portable power supplies (sometimes referred to as inverters) that utilize batteries to provide power to an inverter which in turn provides AC output power to operate corded power tools designed to operate from wall/AC mains line power. These conventional battery based portable power supplies utilize integral batteries or conventional sealed lead acid (SLA) batteries. Although this allows the user to operate the corded power tool without having access to wall/AC mains line power, it does not allow the user to remove the battery from the portable power supply and use the battery to operate a set of cordless power tools. In other words, conventional systems provide for a battery pack for operating a set of cordless power tools and a battery for operating the battery based portable power supply wherein the battery pack for operating the set of cordless power tools cannot supply power to the portable power supply and the battery for operating the portable power supply cannot supply power to the cordless power tools. In the power tool industry, it is desirable to be able to use cordless power tool battery packs to drive the corded power tools. In addition, it is desirable to use cordless power tool battery packs to run non-power tool electrical device that are also designed to operate from wall (AC, mains line) power.

Another aspect of this disclosure is operating electrical devices that normally operate on mains line power, for example corded power tools, to simultaneously use the mains line power and battery power to increase the power available to perform work.

Traditionally the mains line power supply in the US is limited to 15 or 20 amps from a 120 volt AC power receptacle. Because the 15 amp branch circuit is relatively common conventional devices that plug into a standard 120 volt AC power receptacle are designed around this 15 amp limit. Such a design limits the input power from the AC mains line to about 1800 watts and thus the output power of a typical motor will be about 1200 watts, taking into account various system efficiencies. For short durations these power levels may be exceeded, but at the risk of opening the circuit protection device associated with the branch circuit supplying the load. There are many power tool applications that would benefit from the power beyond what can be effectively delivered through the 120 volt AC power receptacle. Currently the only options for these applications are to utilize a special receptacle, a generator with special receptacles or alternative motive power such as an internal combustion engine. This aspect presents a method and system to deliver higher operating power without special receptacles or internal combustion engines attached to the electrical device.

SUMMARY

According to an embodiment, a power supply apparatus is provided including a housing, at least one battery receptacle provided on the housing for receiving at least one removable battery pack, an inverter configured convert a direct-current (DC) signal from the at least one battery pack to an alternating-current (AC) signal, and a controller configured to apply a pulse-width modulation (PWM) signal to the inverter to shape the AC signal with a lower harmonic distortion relative to a square wave. In an embodiment, for each full cycle of the AC signal, the controller is configured to set the duty cycle to approximately 100% within a first period corresponding to a peak area of the AC signal, set the duty cycle to less than approximately 100% but greater than approximately 0% within a second period in which the AC signal transitions from the peak to a zero-cross following the first period, and set the duty cycle to approximately 0% within a third period corresponding to the zero-cross of the AC signal following the second period.

According to an embodiment, the power supply apparatus further includes a filter configured to shape the AC signal by integrating high frequency components thereof. The AC signal, after modulation and filtering, includes a first period corresponding to a peak area of the AC signal within which the AC signal is maintained at a peak voltage, a second period in which the AC signal is sloped to transition from the peak to a zero-cross following the first period, and a third period corresponding to the zero-cross of the AC signal following the second period within which the AC signal is maintained at zero.

DETAILED DESCRIPTION

Figure 1:
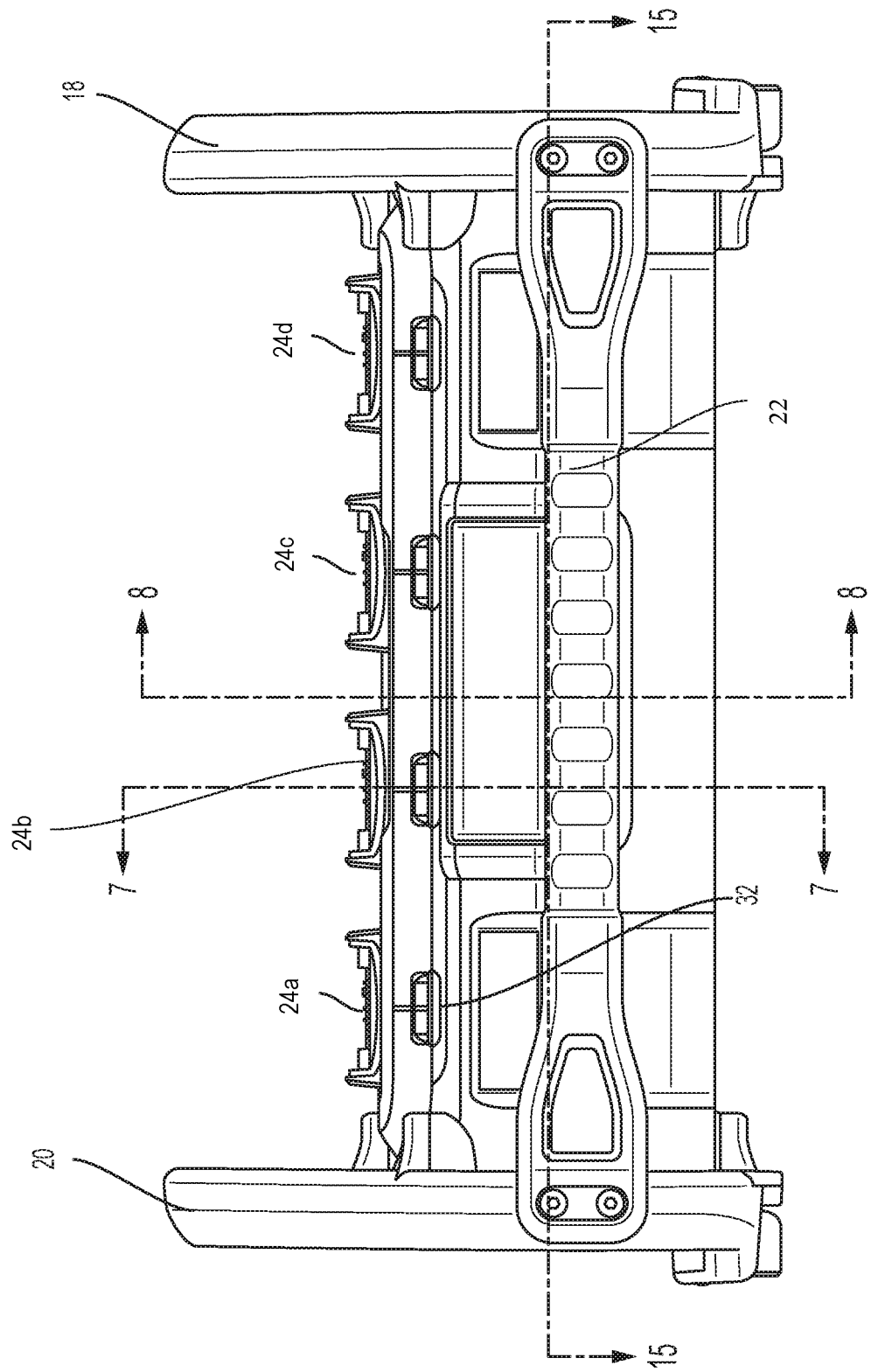
FIG. 1 is a front elevation view of an exemplary embodiment of a portable power supply of the present disclosure.
Figure 2:
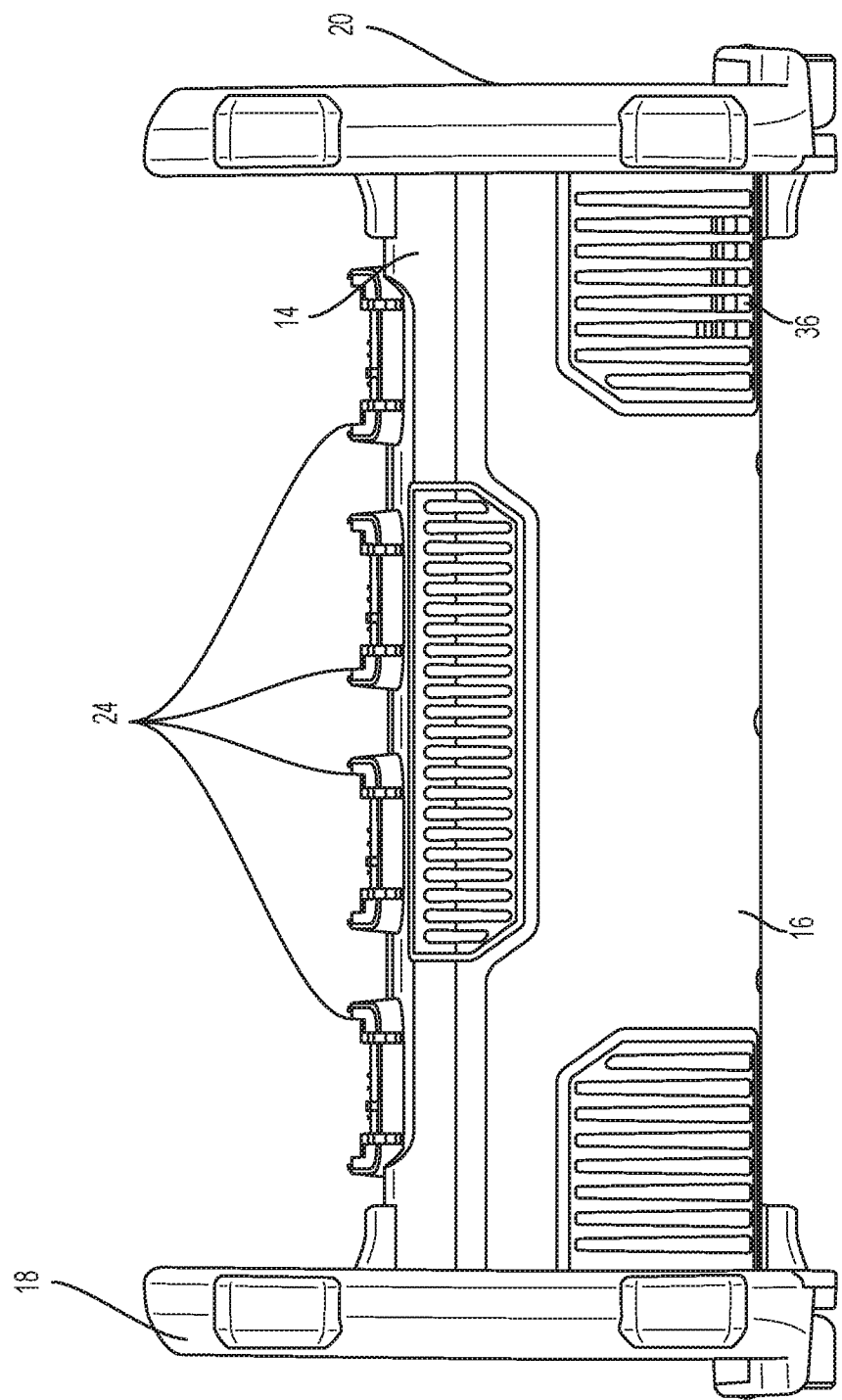
FIG. 2 is a rear elevation view of the portable power supply of FIG. 1.
Figure 3:
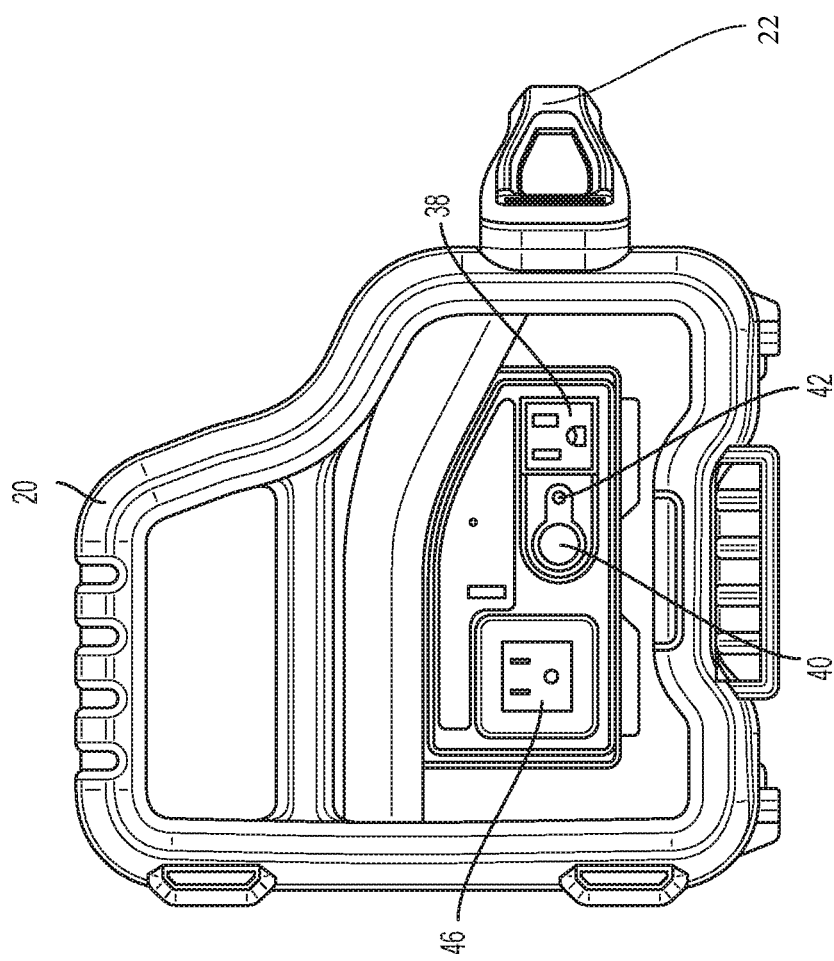
FIG. 3 is a first side elevation view of the portable power supply of FIG. 1.
Figure 4:
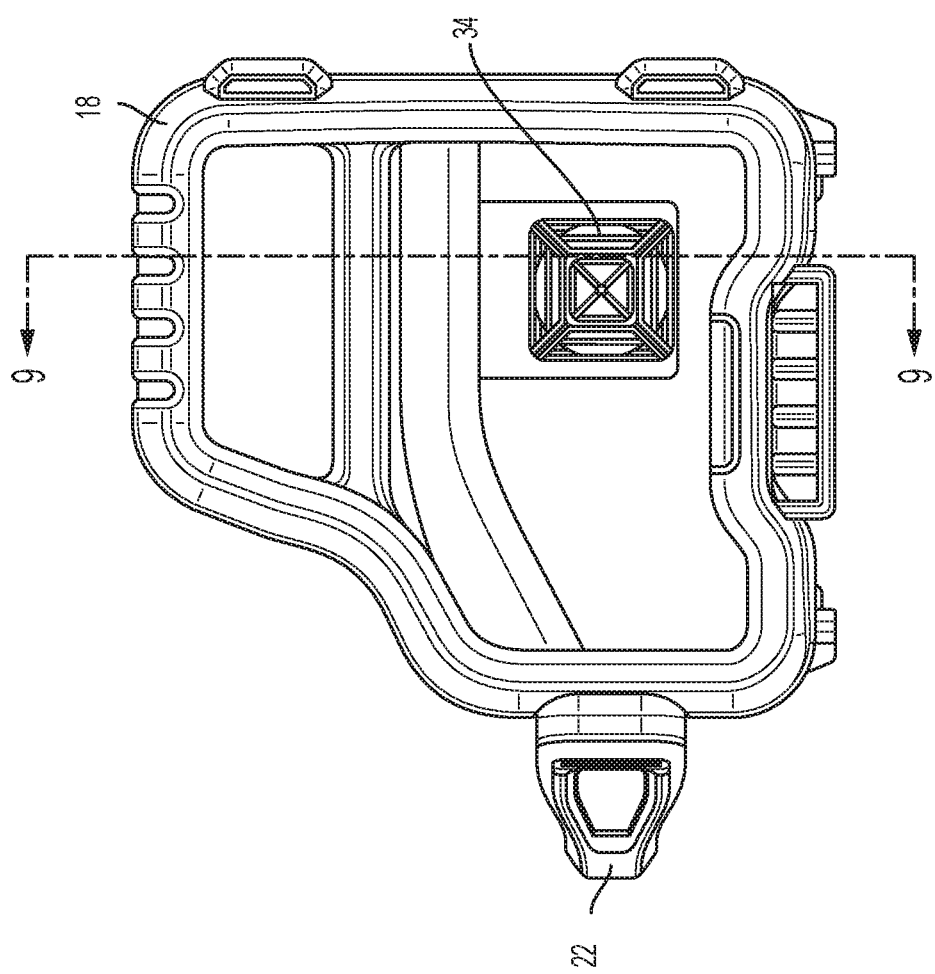
FIG. 4 is a second side elevation view of the portable power supply of FIG. 1.
Figure 5:
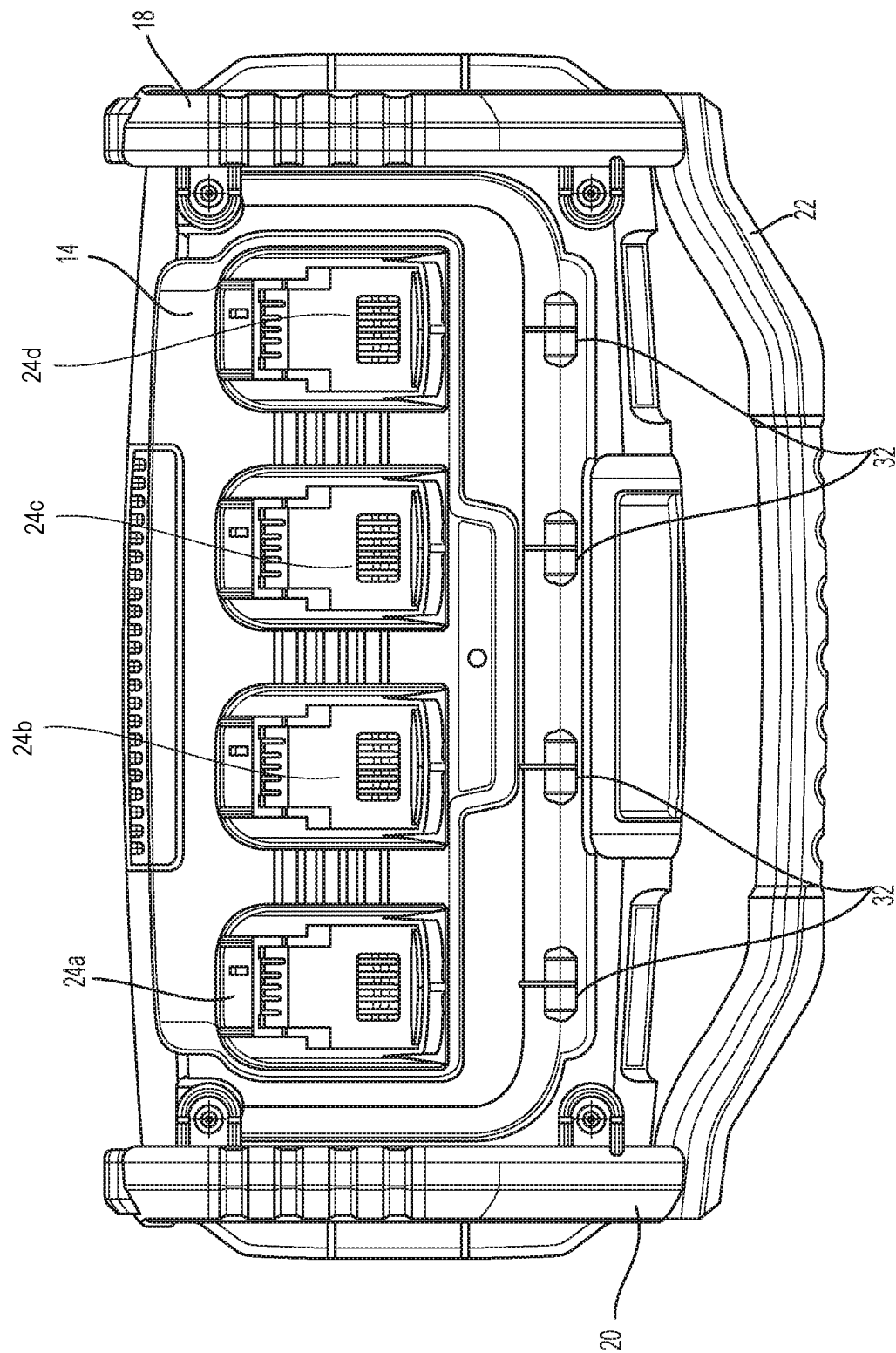
FIG. 5 is a top plan view of the portable power supply of FIG. 1.
Figure 6:
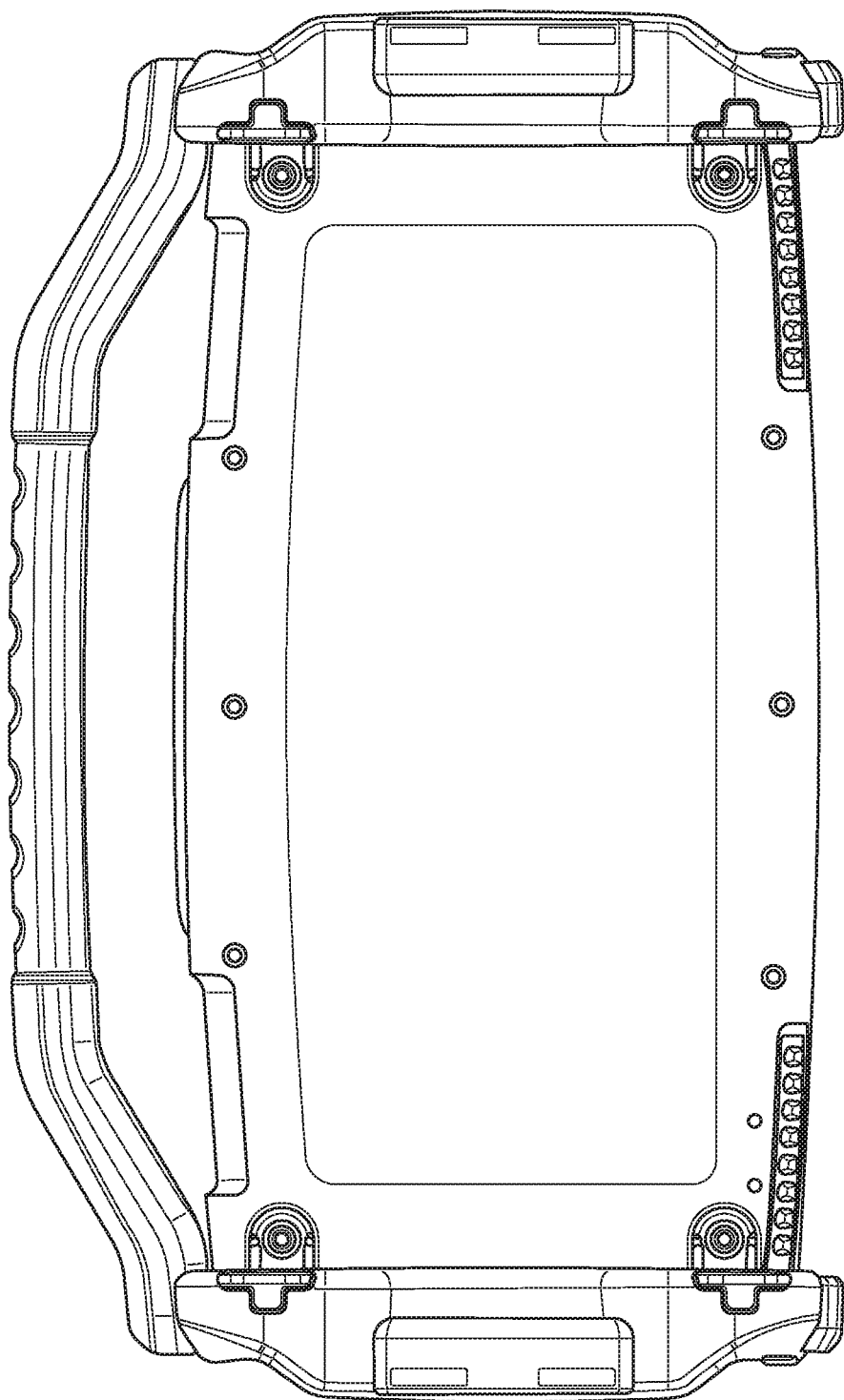
FIG. 6 is a bottom plan view of the portable power supply of FIG. 1.

FIGS. 1 through 6 illustrate an exemplary embodiment of a portable power supply (PPS) system 100 of the present invention. The PPS system 100 includes a housing 12. The housing 12 may include an upper housing portion 14 and a lower housing portion 16. The PPS system 100 may also include two side handles 18, 20 and a front handle 22. In the exemplary embodiment of the PPS system 100, there are four battery pack receptacles 24a, 24b, 24c, 24d (BPR1, BPR2, BPR3, BPR4). The battery pack receptacles 24 may also be referred to as battery interfaces or battery ports. The PPS system 100 may also include a battery pack indicator 32. The battery pack indicator 32 may be an LED or other type of light emitting device. The battery pack indicators 32 indicate the status of a battery pack 26 coupled to the associated battery pack receptacle 24. The PPS system housing 12 may also include an airflow input port 34 and an airflow output port 36 to enable air to flow into and out of the PPS system 100. The PPS system 100 may also include an alternating current (AC) output connector 38. The AC output connector 38 may take the form of a three-prong receptacle. The PPS system 100 may also include an inverter start (or activation) switch 40. The PPS system 100 may also include an inverter operation indicator 42. The inverter operation indicator 42 may be in the form of an LED. The inverter operation indicator 42 will be illuminated when an inverter 44 of the PPS system 100 is active. The PPS system 100 may also include an AC input connector 46. The AC input connector may take the form of a three-prong plug.

Figure 7:
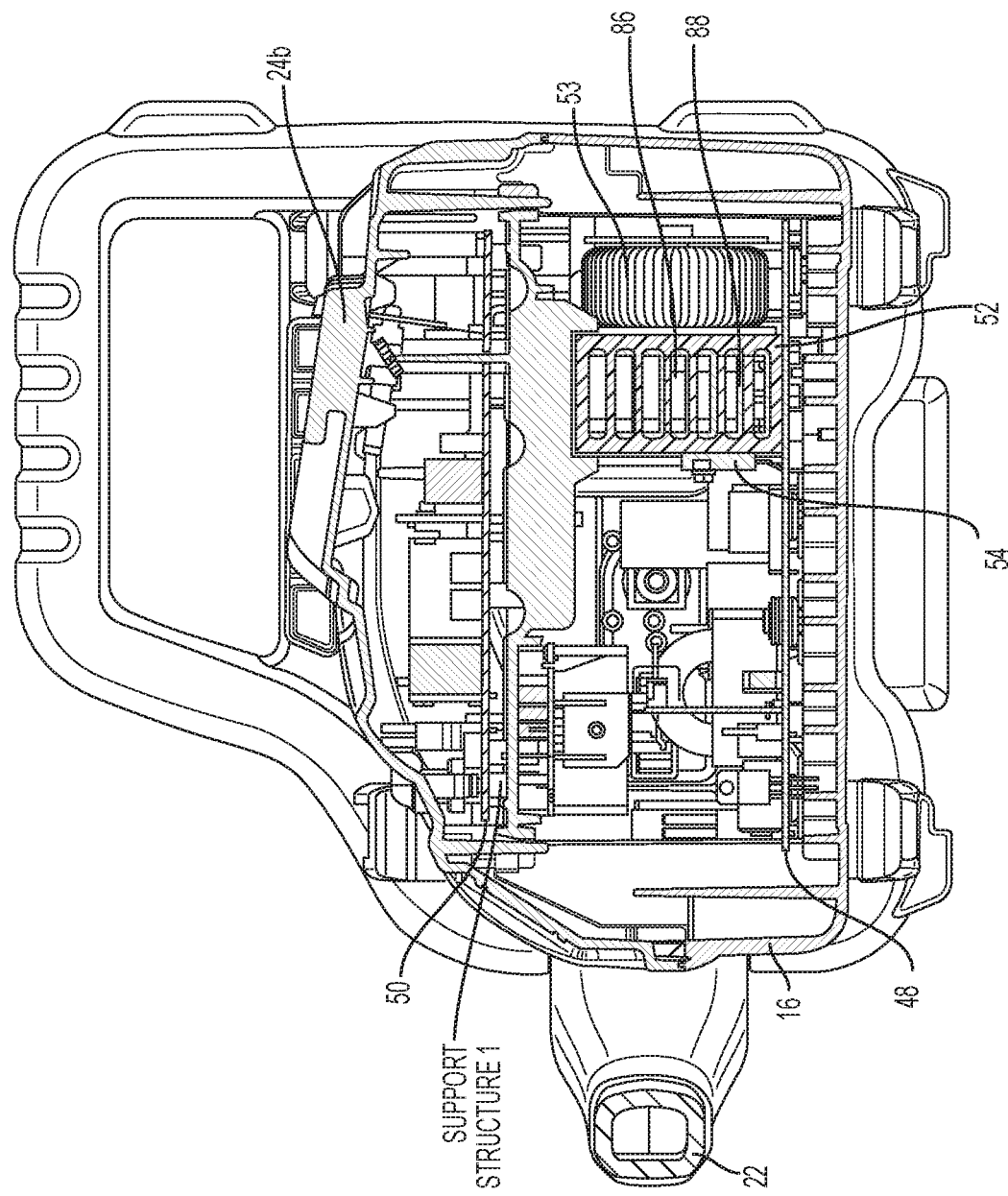
FIG. 7 is a section view along 7-7 of the portable power supply of FIG. 1.
Figure 8:
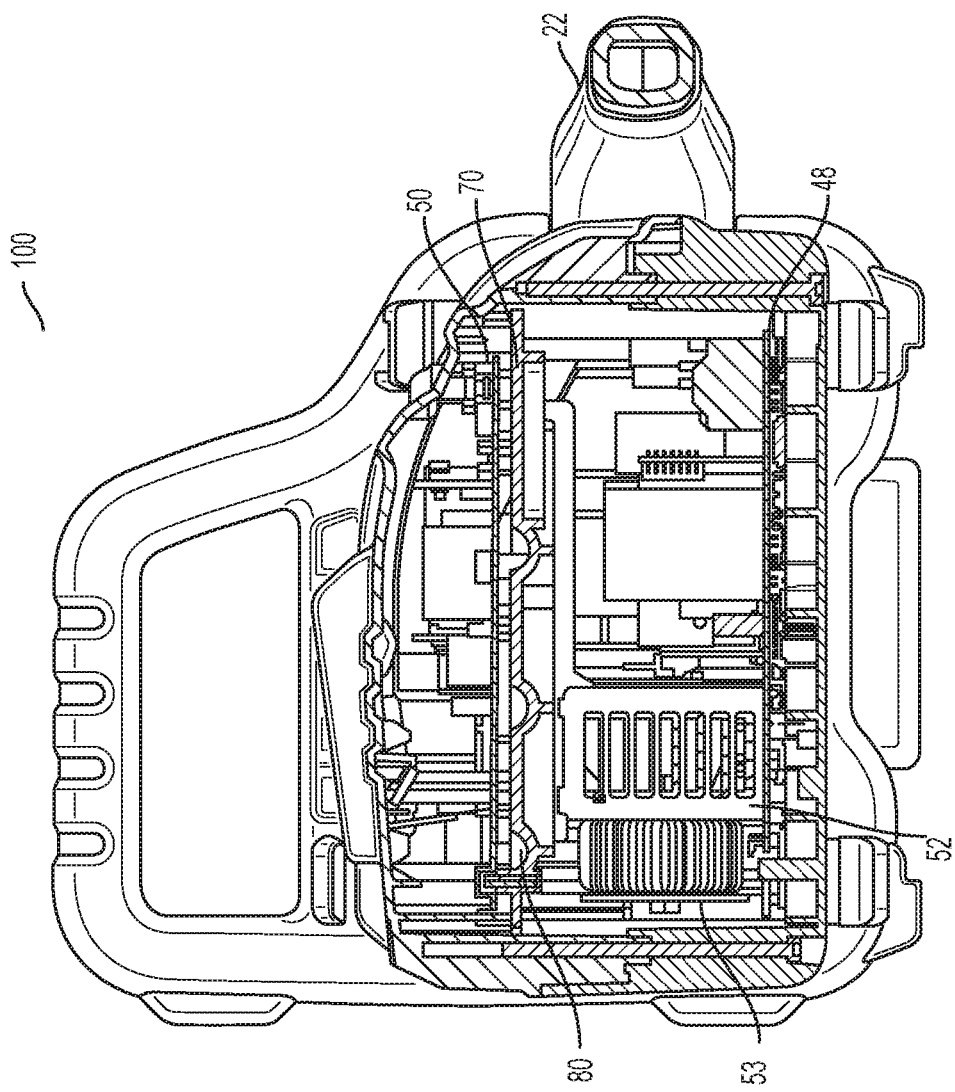
FIG. 8 is a section view along 8-8 of the portable power supply of FIG. 1.
Figure 9:
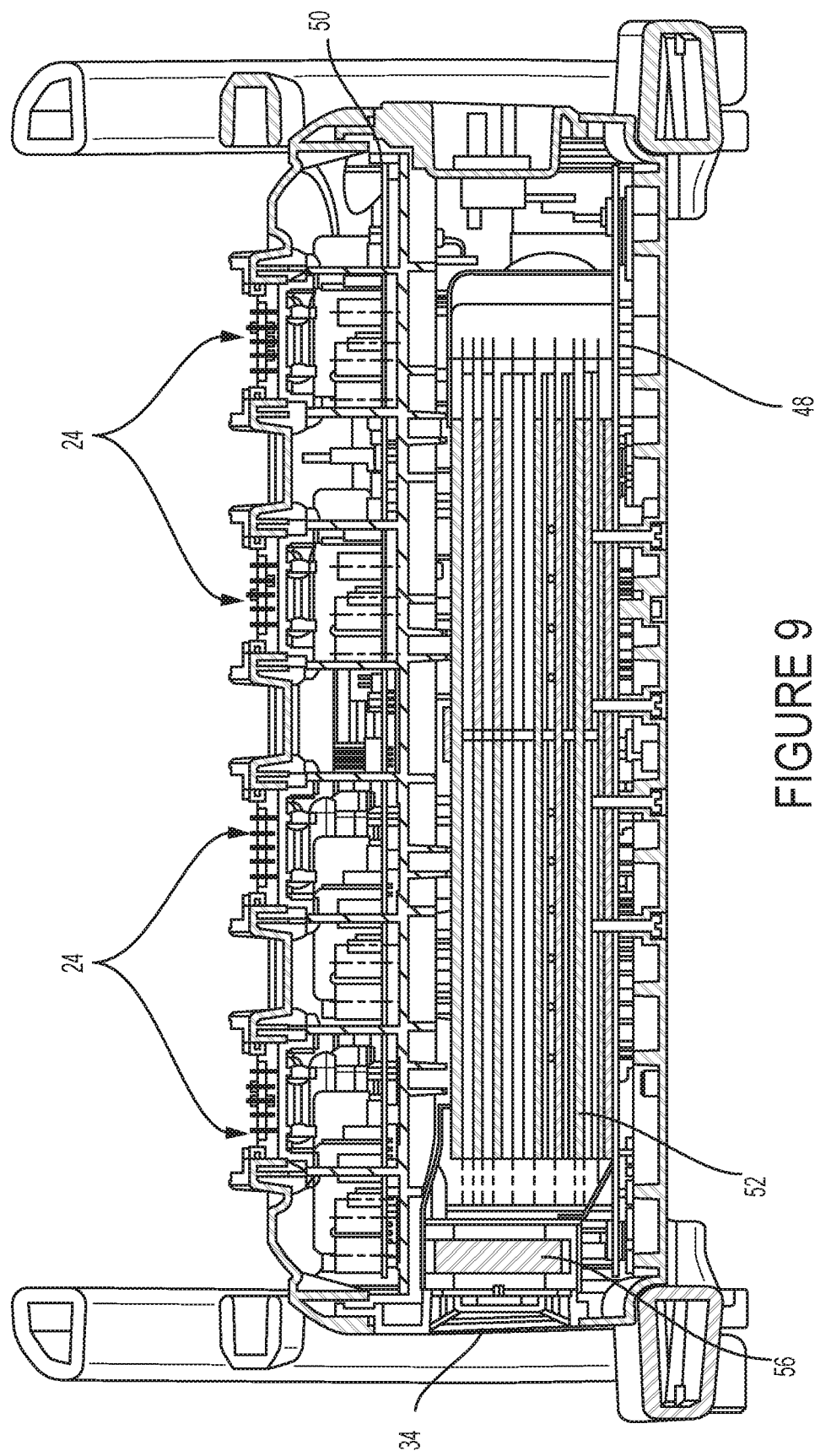
FIG. 9 is a section view along 9-9 of the portable power supply of FIG. 4.
Figure 10:
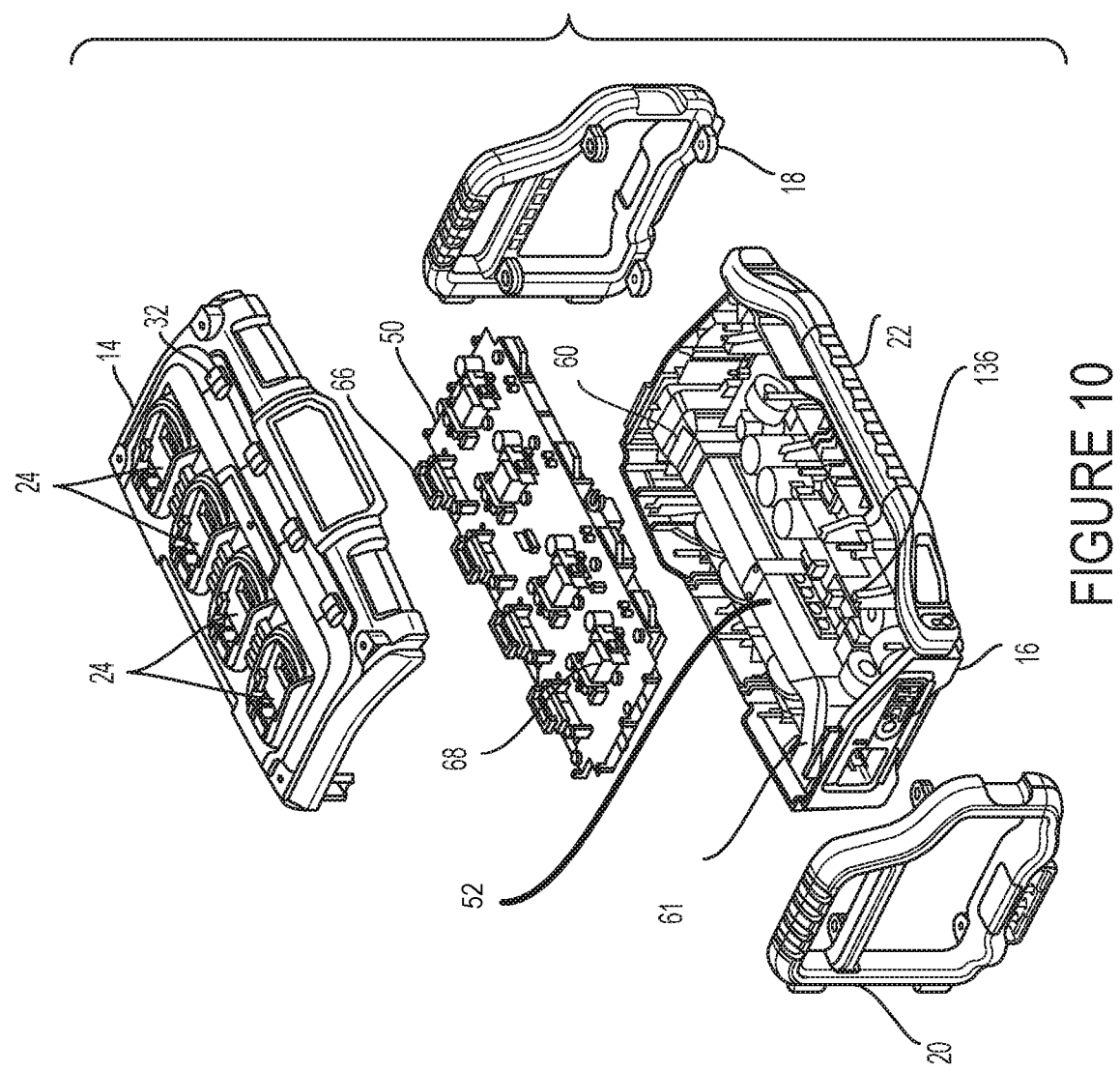
FIG. 10 is a perspective exploded view of the portable power supply of FIG. 1.
Figure 11:
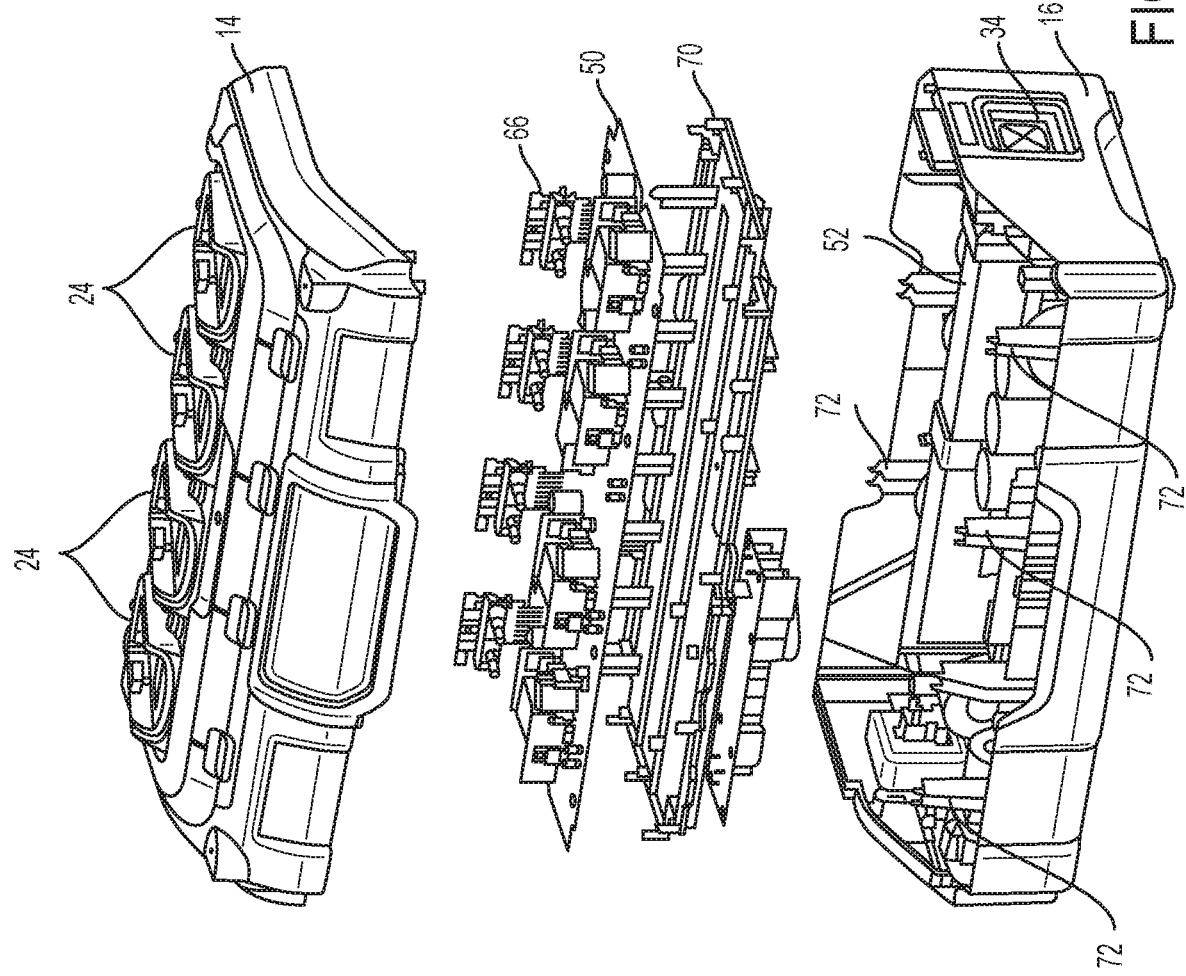
FIG. 11 is another perspective exploded view of the portable power supply of FIG. 1.
Figure 12:
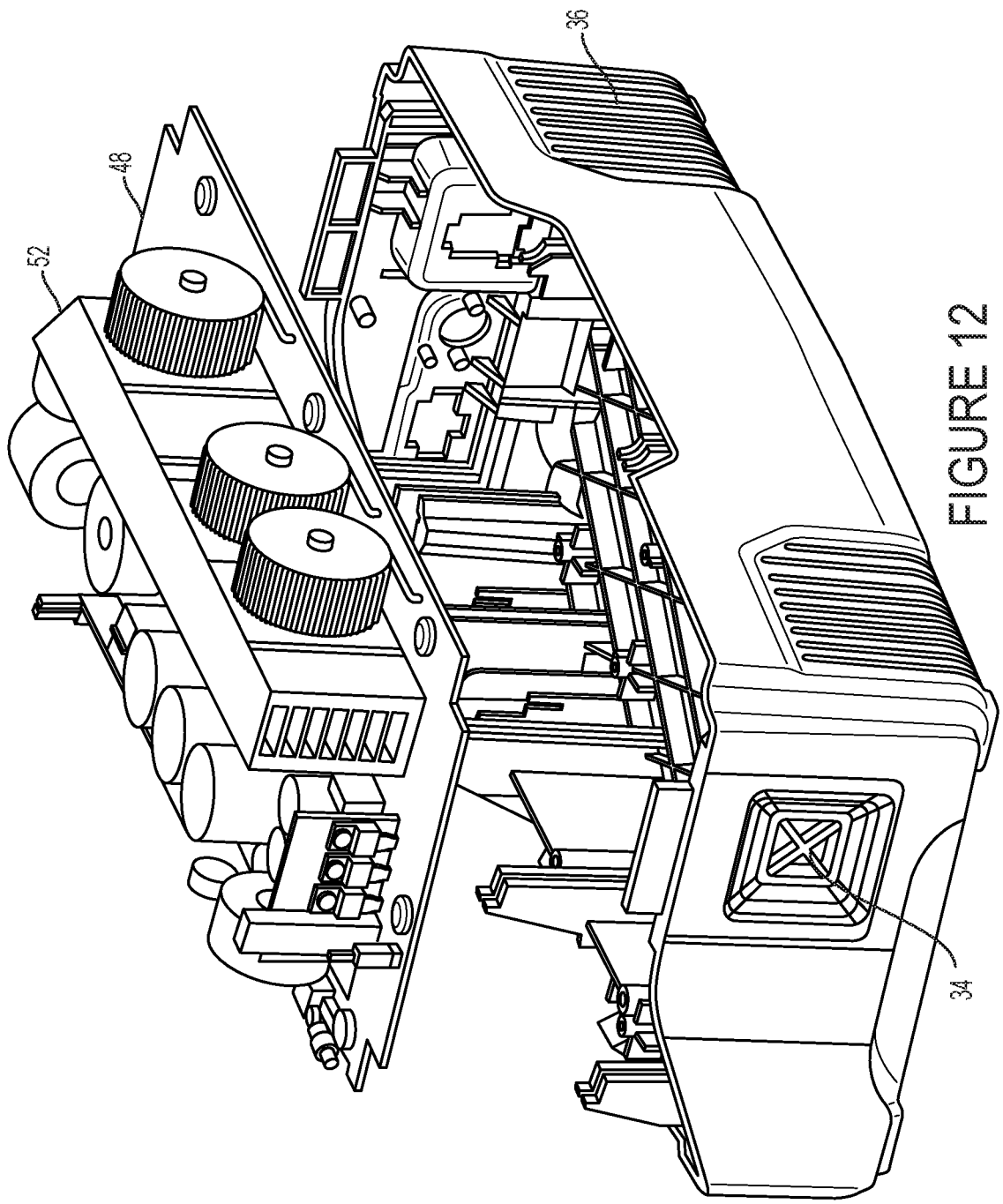
FIG. 12 is another perspective exploded view of the portable power supply of FIG. 1.
Figure 13:
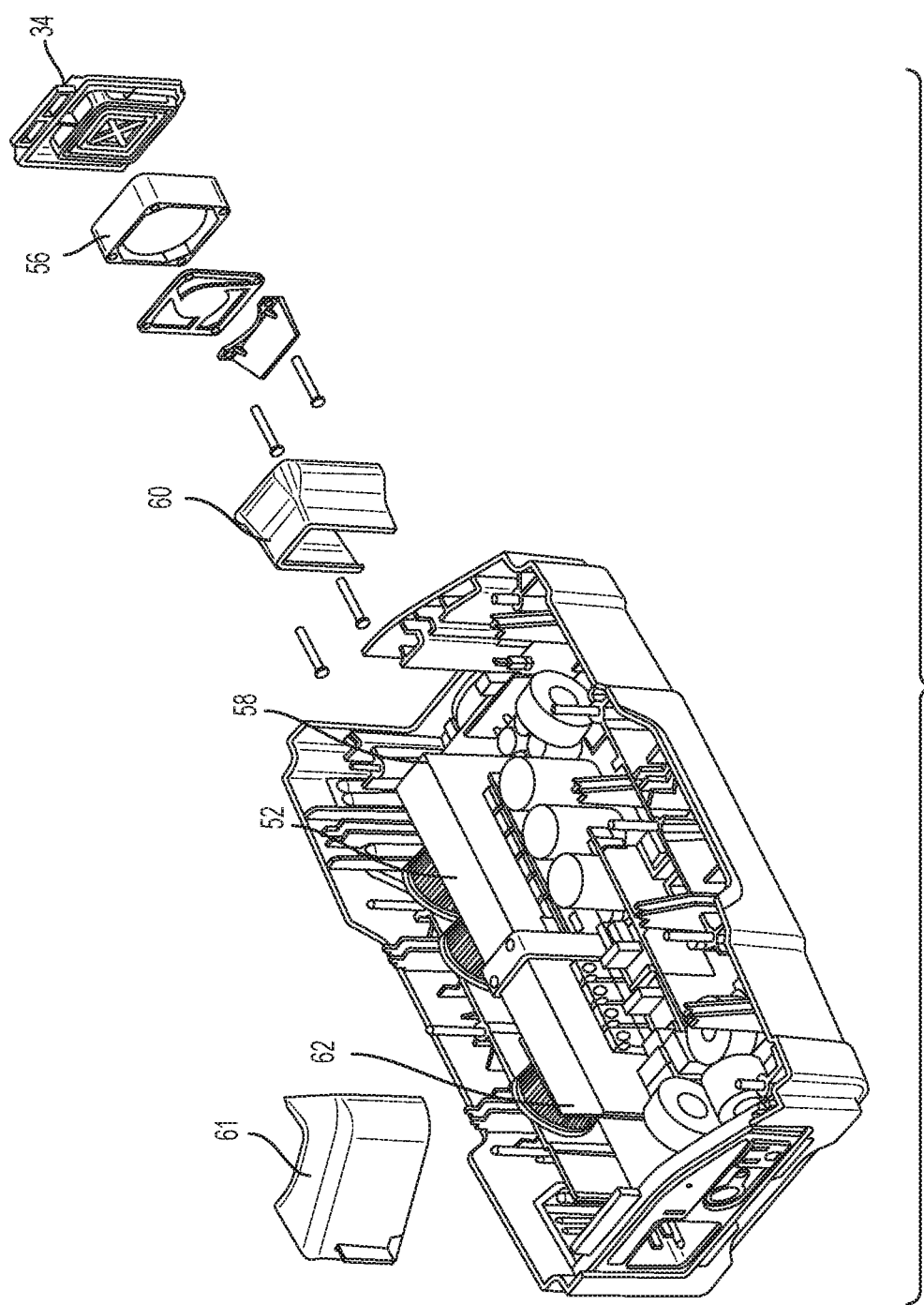
FIG. 13 is another perspective exploded view of the portable power supply of FIG. 1.
Figure 14:
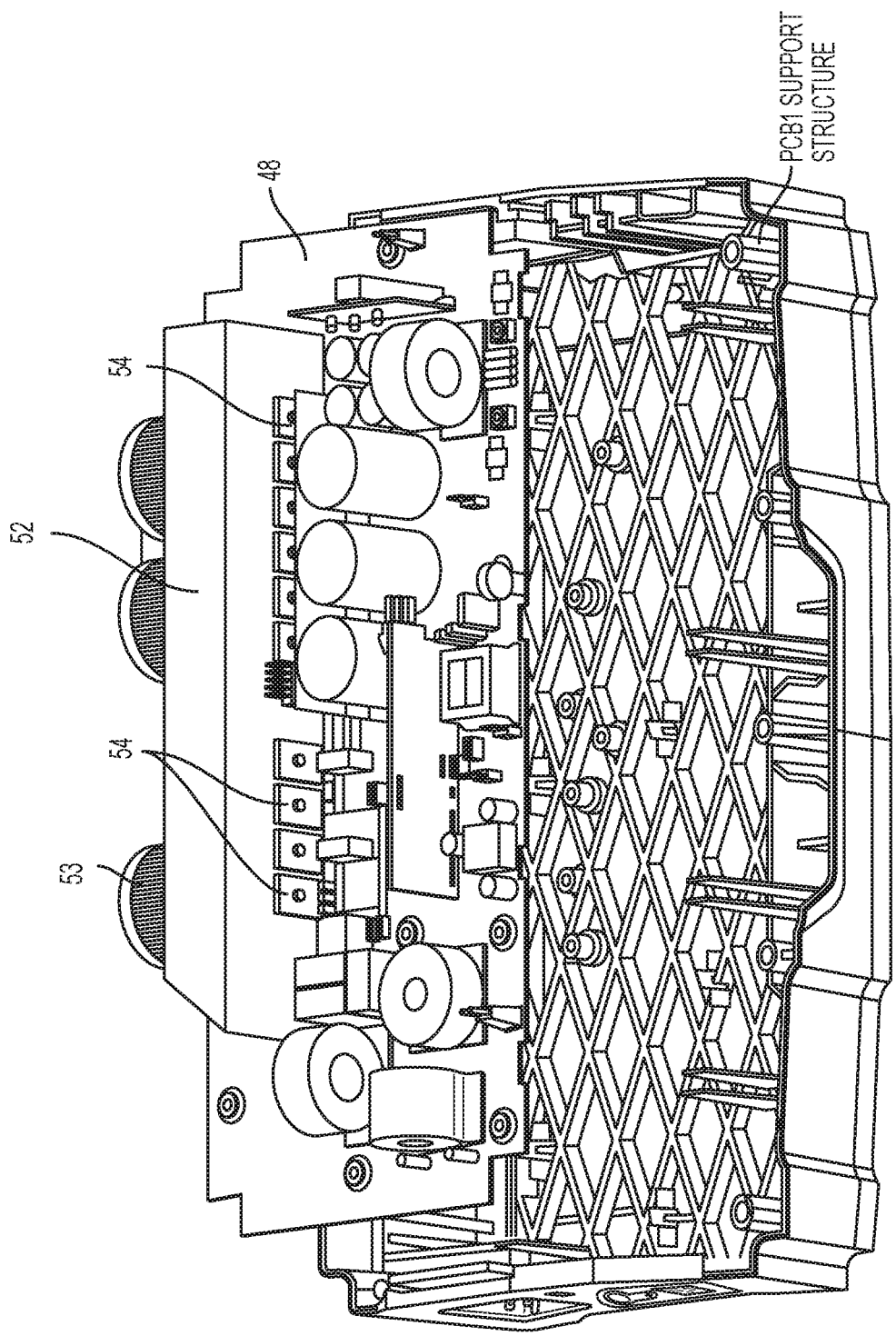
FIG. 14 is another perspective exploded view of the portable power supply of FIG. 1.
Figure 15:
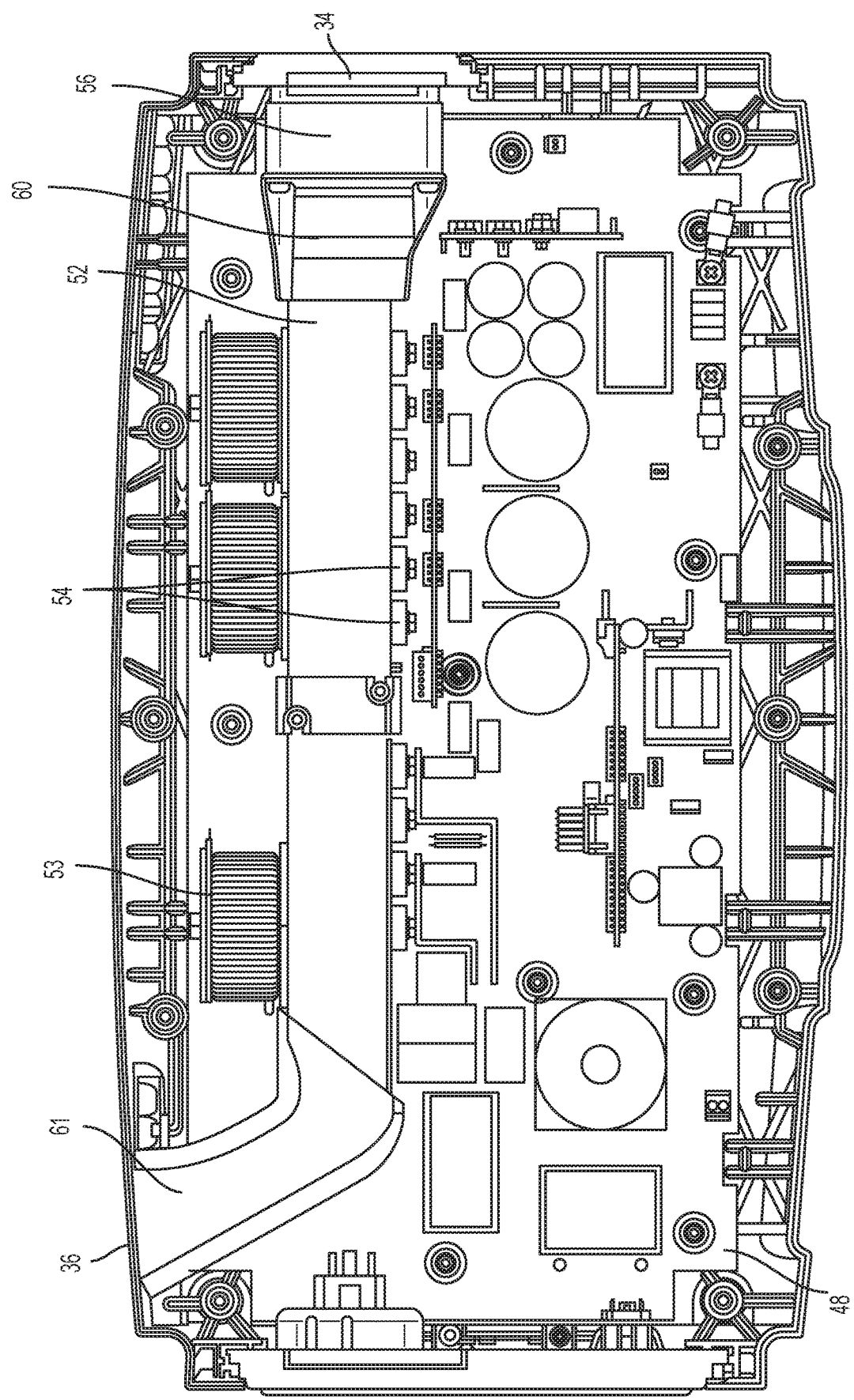
FIG. 15 is a top plan view of the interior of the portable power supply of FIG. 1.

FIG. 7 illustrates a first section view of the PPS along lines 7-7 of FIG. 1. FIG. 8 illustrates a second section view of the PPS along lines 8-8 of FIG. 1. FIG. 9 illustrates a third section view of the PPS along lines 9-9 of FIG. 4. FIG. 15 illustrates a fourth section view of the PPS along lines 15-15 of FIG. 1. These section views illustrate many of the internal components of the PPS.

FIGS. 10-14 illustrate exploded views of the PPS system 100. As illustrated in the figures, the PPS system 100 may include a first printed circuit board PCB1 48 and a second printed circuit board PCB2 50 for mounting various components of the PPS system 100. The PCB1 48 is used primarily to mount components related to the inverter 44 and the PCB2 50 is used primarily to mount components related to the charging system.

The PPS system 100 includes a heat sink 52 mounted on the PCB1 48. The heat sink 52 may be an elongated tube having a longitudinal axis and an internal passage or channel extending along the longitudinal axis from a first end 58 of the heat sink 52 to a second end 62 of the heat sink 52. The PPS system 100 includes, for example, a plurality of inductors 53 and FETs 54 mounted to the heat sink 52. The inductors 53 and FETs 54 generate heat during operation of the inverter 44. The heat sink 52 sinks the heat generated by the inductors 53 and FETs 54. The PPS system 100 includes a fan 56 positioned between the airflow input 34 and a first end 58 of the heat sink 52. The PPS system 100 includes a first heat sink coupler 60 connecting the first end 58 of the heat sink 52 to the fan 56 and an opening in the lower housing portion 16 and a second heat sink coupler 61 connecting a second end 62 of the heat sink 52 to the airflow output 36. The heat sink 52 and the heat sink couplers 60, 61 provide a sealed path for air to flow from the airflow input 34, through the internal passage of the heat sink 52 and to the airflow output 36 to move heat generated by the inductors 53 and FETs 54. The PPS system 100 includes an inverter microprocessor or microcontroller circuit 64 mounted to the PCB1 48 for monitoring and controlling the inverter 44.

The PPS system 100 includes a plurality of battery terminal blocks 66 mounted on the PCB2 50. There is one battery terminal block 66 for each battery pack receptacle 24. The PPS system 100 includes a plurality of chargers 68 and associated components mounted on the PCB2 50. There is one charger 68 and associated components for each battery pack receptacle 24.

Floating Middle Mounting Plate

In order to provide a compact system that provides both a charging system for charging a plurality of removable battery packs and an inverter system for converting DC power to AC power it is imperative to provide a compact printed circuit board system. The present invention presents a method for suspending a first printed circuit board above a second printed circuit board. An objective is to allow the two printed circuit boards inside the PPS system to each extend horizontally and yet be stacked vertically relative to each other. The printed circuit boards also need to be separated from each other enough to allow for heat dissipation and the mounting of the various necessary components.

The exemplary PPS system 100 is an electronic device having two main functions: 1) charge a plurality of removable battery packs 26 simultaneously (the exemplary embodiment includes the ability to charge four (4) battery packs simultaneously) and 2) convert the DC power of the removable battery packs 26 into 120V AC power.

To accomplish these functions, the unit contains two primary large printed circuit boards—one for the charging function and one for the inverter function. The system is similar to existing battery pack chargers in that there is a printed circuit board that includes components to convert the incoming AC power to DC power to charge and monitor the battery packs. For the PPS system 100, the unit can charge up to four (4) battery packs 26 simultaneously. The charging printed circuit board 50 is therefore much larger than a circuit board of a charger designed to charge a single battery pack. Including an inverter function in the PPS requires a second printed circuit board 48. Due to the layout and requirements of the PPS system 100, the inverter printed circuit board 48 is positioned below and parallel to the charging printed circuit board 50.

A floating middle plate 70 supports the charging printed circuit board PCB2 50. The middle plate 70 rests on a set of supports 72 that are part of the lower housing portion 16. The middle plate 70 is supported around its perimeter only. The shape and size of the inverter printed circuit board PCB1 48 is such that the inverter printed circuit board PCB1 48 sits within the geometric shape defined by the set of supports 72 to enable the set of supports 72 to support the middle plate 70. The middle plate 70 includes screw hole features for both the charging printed circuit board 50 on the top surface as well as screw hole features for a smaller AC filter board to be suspended underneath the middle plate 70. Additional screw hole features are included to attach various devices used for securing and locating wires. In addition to the pad features on the lower housing portion 16 that support the middle plate 70, there are two pins that protrude downward from the upper housing portion to locate the middle plate in the proper relationship to the upper housing portion. The middle plate 70 is termed "floating" because it rests on the set of supports 72 and is not rigidly fastened to the lower housing portion 16. The charger printed board 50 supports the battery pack terminal blocks 66. In order to position the battery pack terminal blocks 66 relative to the upper housing portion 14 and the battery pack receptacles 24, the middle plate 70 is not secured to the lower housing portion 16 and the locating pins for the middle plate 70 come from the upper housing portion 14. The middle plate 70 is responsible for maintaining the shape of the charger printed circuit board 50 during drop and vibration events in order to prevent damage to the components of the charger printed circuit board 50. As it is not possible to support the center of the middle plate 70 from below (due to the positioning of the inverter printed circuit board PCB1 48), the middle plate 70 includes a plurality of "U" shaped channels 80 that run parallel to a long axis 82 of the middle plate 70 to prevent flexing and bending of the middle plate 70 and the charger printed circuit board 50, as much as possible.

The floating middle plate 700 allows location features to be added to upper housing portion 14. When the upper housing portion 14 is coupled to the lower housing portion 16 the middle plate 70 can move to align the terminal blocks 66 (mounted to middle plate 70) with the battery pack receptacle 24 of the upper housing portion 14.

Heat Sink as Structural Element

Due to the size of the PPS system 100 and the internal printed circuit boards 48, 50, it is preferred to include a system to support the printed circuit boards housed inside the PPS system to prevent them from becoming damaged. The printed circuit boards 48, 50 and the components mounted thereon, need to withstand standard product requirements including drop and vibration standards. If the printed circuit boards 48, 50 are subjected to large amounts of vertical deflection during these events, the mounted components could break off or become damaged and hinder the operation of the system. The PPS housing is a relatively large, open five sided box constructed from plastic materials and is limited in the amount of structure it can provide.

The inverter printed circuit board PCB1 48 includes many heavy electronic components that are susceptible to damage due to flex when dropped. In addition, many of the various electronic components necessary to implement an inverter generate significant amounts of heat during operation. As such, the PPS system 100 requires a heat sink to collect and dissipate the generated heat. In the exemplary embodiment disclosed in this application a heat sink 52 is included that is mounted on the inverter printed circuit board PCB1 48. The heat sink 52 may be made of aluminum.

The inverter printed circuit board PCB1 48 has a generally planar shape (forms a plane). The heat sink is positioned relative to the inverter printed circuit board PCB1 48 such that the longitudinal axis of the heat sink is parallel to the plane formed by the inverter printed circuit board PCB1 48. The electronic components that generate heat, such as the inductors 53 and the FETs 54 are attached to the heat sink 52. The heat sink 52 may have a rectangular cross section with a hollow center 86. The heat sink 52 may include a plurality of ribs 88 crossing the hollow center. An electric fan 56 draws air from outside the PPS system 100 into the PPS system 100 through the airflow input 34 and forces it into one end of the heat sink 52. The air flows though the heat sink 52, collects heat from the electronic components and is then exhausted out the other end of the PPS system 100 through the airflow output 36 to outside the PPS system 100.

The structural/physical shape and material of the heat sink 52 provide rigidity to the inverter printed circuit board PCB1 48. The heat sink 52 is first attached to the inverter printed circuit board PCB1 48 using a plurality of screws through the printed circuit board PCB1 48. Once the heat sink 52 and the inverter printed circuit board 48 have been installed into the lower housing portion 16, a second set of screws are used to secure the heat sink 52 to the lower housing portion 16. This provides a direct structural link between the lower housing portion 16 and metal heat sink 52. This is in addition to rubber mounting points used elsewhere to mount the inverter printed circuit board 48 to the lower housing portion 16. In the event of a drop or vibration, the structural heat sink 52 reduces the amount of deflection in the lower housing portion 16 and the inverter printed circuit board 48. This in turn limits the movement of the components mounted to the inverter printed circuit board PCB1 48 and the charger printed circuit board PCB2 50 and helps protects them from damage.

As such, the heat sink 52 serves the dual purpose of heat sink and structural element. No additional components need to be added to provide rigidity to the assembled PPS system 100 to prevent flexing of the lower housing portion 16. Mounting the heat sink 52 to the inverter printed circuit board 48 and the lower housing portion 16 also provides an improved rigidity to the middle plate 70 above the heat sink 52 to limit deflection of the charger printed circuit board PCB2 50.

Enhanced Modified Sine Wave Control of Inverter

Figure 16:
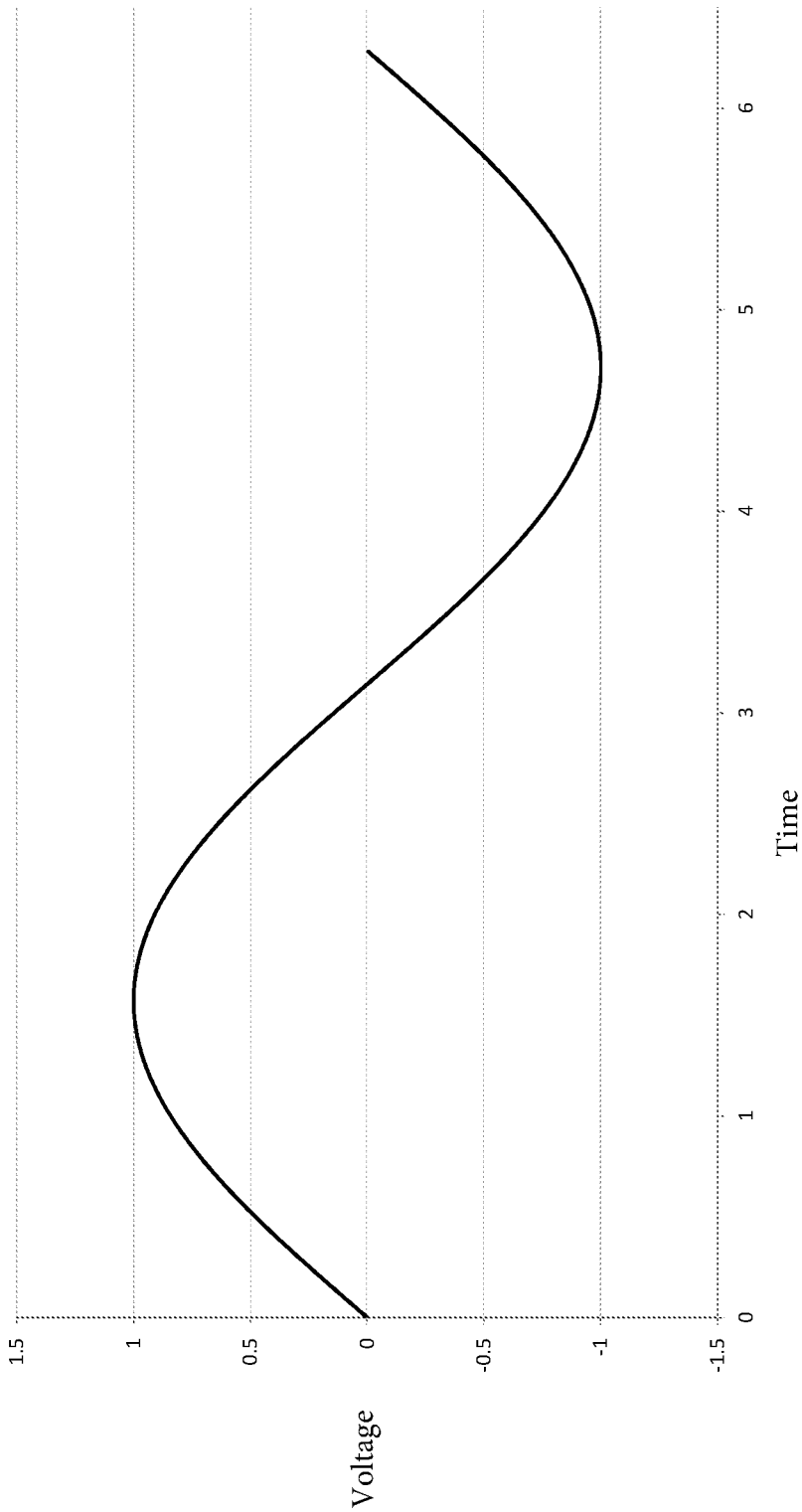
FIG. 16 is a graph illustrating an exemplary sine wave.

There are multiple hardware and software control methodologies employed in conventional power inverters to produce alternating current output waveforms. The most common of these methodologies produce several types of wave forms including, but not limited to, a pure sine wave, a square wave, and a modified sine wave (sometimes referred to as modified square wave). It is well known that AC line power (power provided by public utilities) is typically sinusoidal, an inverter which produces a sine wave output, as illustrated in FIG. 16, would be considered optimal. However, pure sine output inverters are expensive to produce and are relatively heavy as they generally employ costly and heavy transformers. Less expensive inverters that produce square waves or modified sine waves are limited by the sensitivities of the potential coupled loads to non-sinusoidal power waveforms. An enhancement to these inverter configurations is desirable, to allow for economical production, while minimizing load sensitivity to output waveforms.

Figure 17:
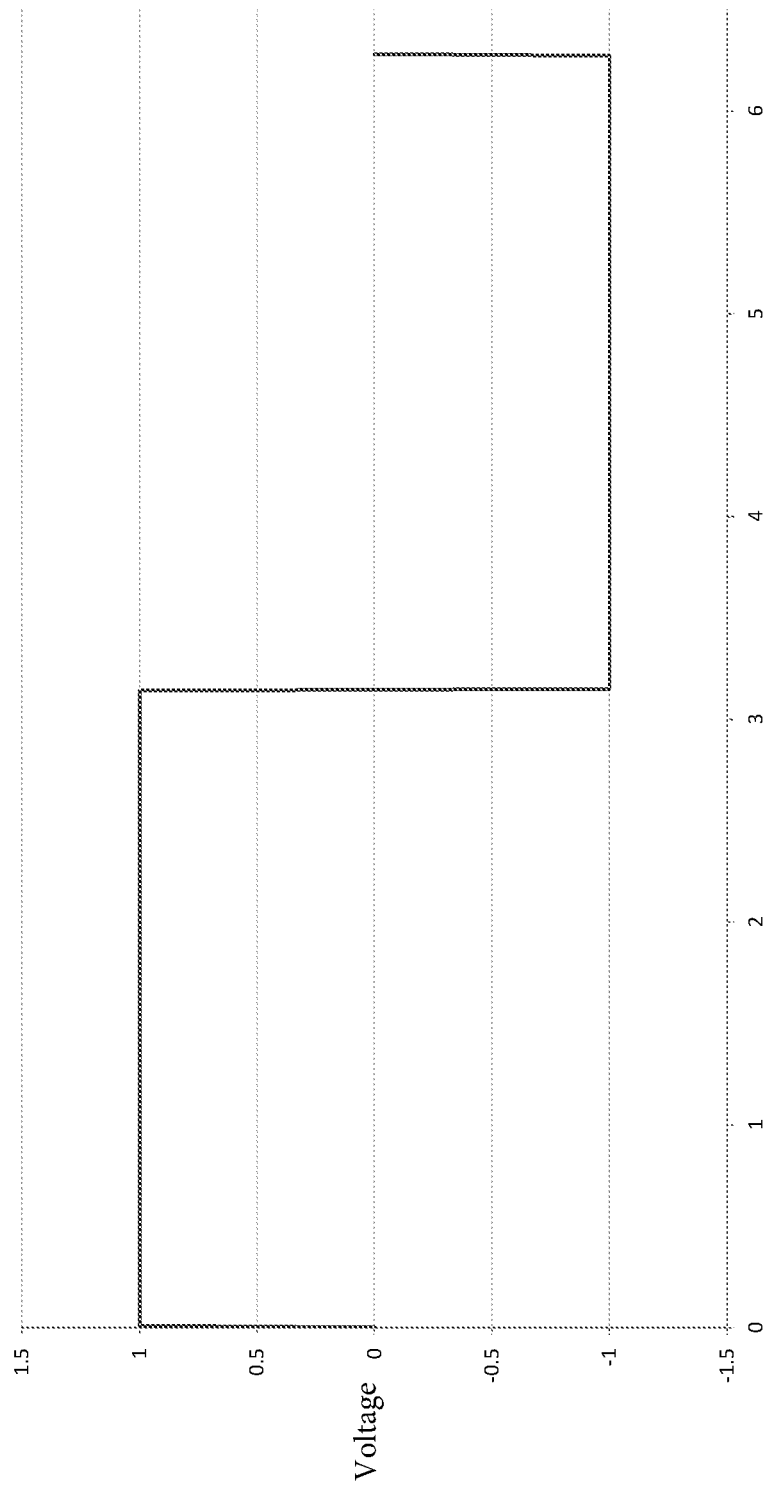
FIG. 17 is a graph illustrating an exemplary square wave.

The simplest power inverter to produce and control employs a square wave topology. The output of a square wave inverter switches on and off symmetrically about a zero potential point (see FIG. 17). While this design is relatively inexpensive and easy to implement, it has the greatest potential for problems. Sophisticated loads with sensitivity to wave shape and to detection of zero-crossing are subject to problems when coupled with a square wave inverter.

Figure 18:
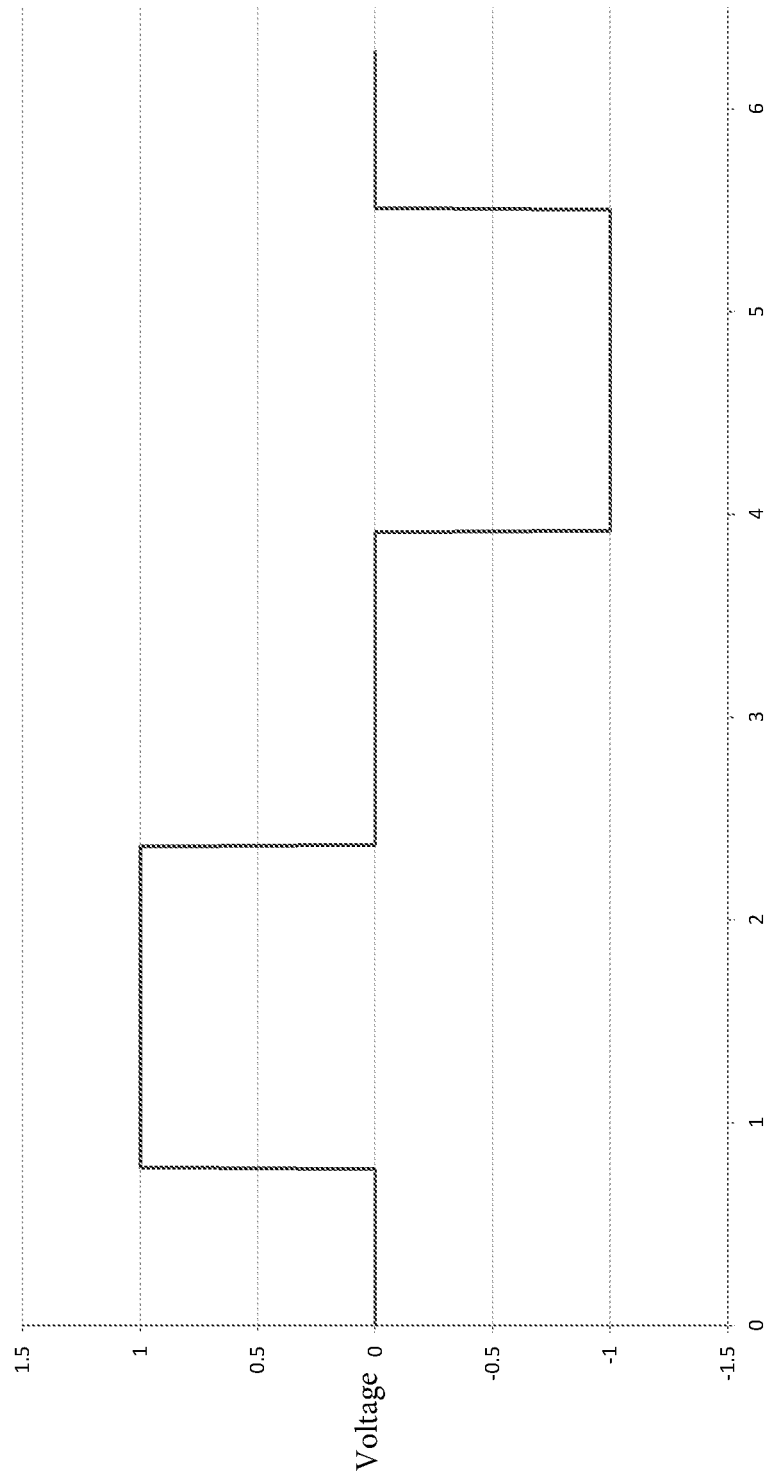
FIG. 18 is a graph illustrating an exemplary modified sine wave.

An improvement over the square wave inverter is the modified sine wave inverter. A modified sine wave inverter produces an output waveform that is an incremental improvement over the square wave, in that it provides a significant dwell time at the zero potential, instead of a direct switching from the highest to lowest potential. (see FIG. 18) This provides a lower harmonic distortion relative to a square wave, and allows for higher peak voltage output, given the same RMS voltage output.

However, the modified sine wave can still present a challenge to some loads which are sensitive to the wave shape of the line source. Among these, are DeWALT AC power tools which include GACC intelligent control. These loads are sensitive to wave shape (and in the case of DeWALT GACC tools, are particularly sensitive to the characteristics of the zero-crossing of the output waveform). An enhancement to traditional modified sine wave control is therefore needed, to provide a more gradual zero crossing, allowing such loads to function on the more economically-produced Modified Sine technology.

In the present invention, the sustained dwell at zero potential in a traditional modified sine wave inverter configuration is enhanced by intelligent control to more closely approximate the characteristics of a true sine waveform. This is achieved by employing pulse-width modulation to produce an intermediate proportional output at various points of the output wave, to provide more gradual transition at the zero crossing.

While it would be possible to employ pulse width modulation (PWM) to synthesize a large number of different modulation points throughout the wave, producing in essence, a continuum that very closely approximates the sinusoidal wave, there are several disadvantages to this approach. Firstly, the higher the number of synthesized points in the wave, the higher the necessary PWM frequency. The higher the PWM frequency, the greater the number of switching events per unit time (and therefore the higher the switching losses for the system as a whole). Switching losses produce higher temperatures in the system power semiconductors. Secondly, it is advantageous to provide the switching events which synthesize the necessary gradual transitions, only at lower potentials, producing less electrical switching noise.

For these reasons, it is advantageous to minimize the switching to only that which is necessary to maximize the desired effect (more gradual transitions where the velocity of the wave is highest).

Figure 19:
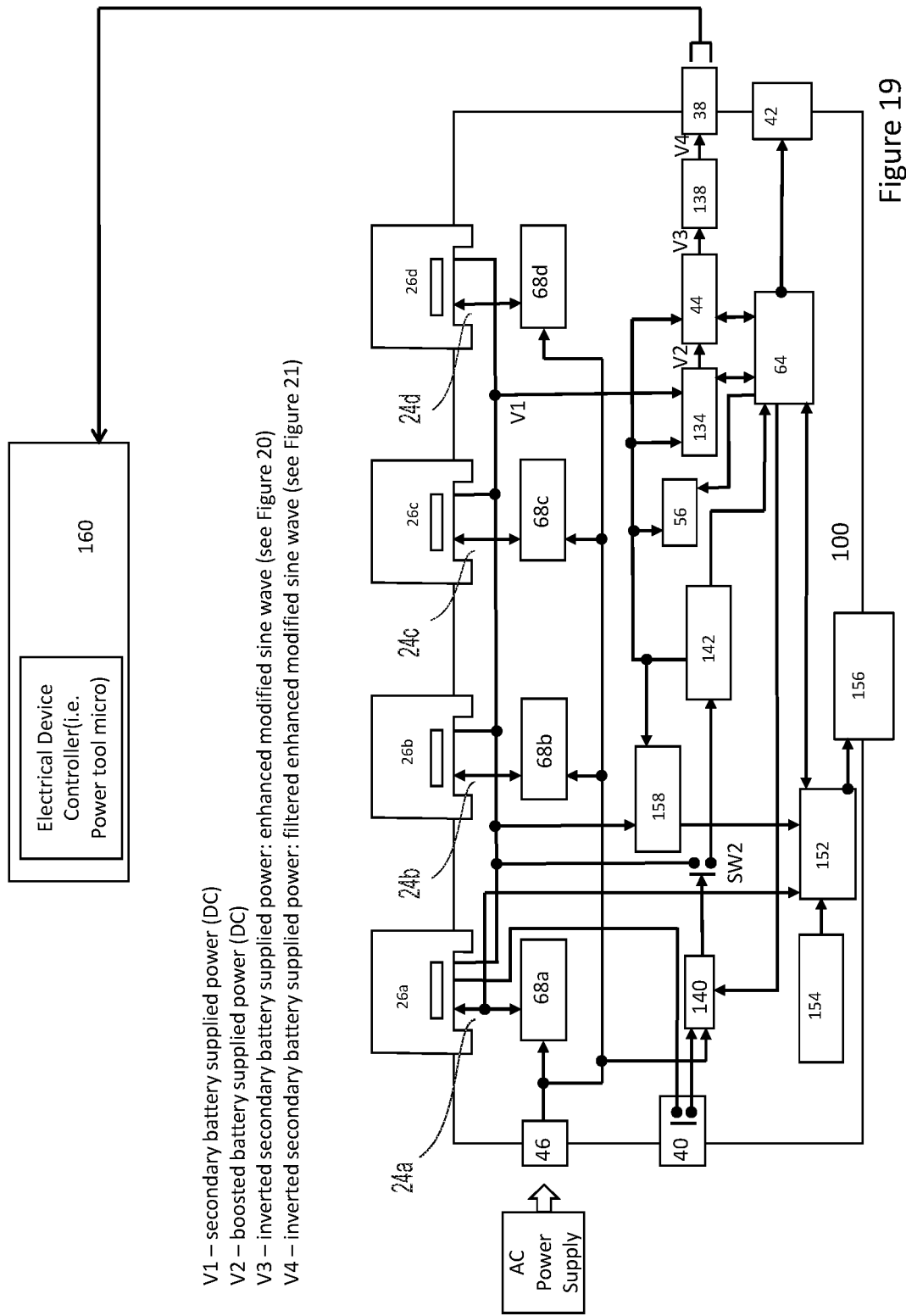
FIG. 19 is a block diagram of an exemplary portable power supply and a corded electrical device.

FIG. 19 illustrates schematic block diagram of an exemplary PPS system 100. The PPS system 100 includes four battery pack receptacles BPR1, BPR2, BPR3, BPR4 24a, 24b, 24c, 24d. Each of the battery pack receptacles 24 is configured to receive a removable battery pack 26. The removable battery pack 26 couples to the battery pack receptacle 24 to electrically and mechanically couple the battery pack 26 to the PPS system 100. The PPS system 100 includes an inverter 44. The inverter 44 is an electrical/electronic circuit configured to convert a DC power signal to an AC power signal. The PPS system 100 also includes a booster 134. The booster 134 is an electrical/electronic circuit configured to boost a DC power signal from a first voltage level to a second voltage level. For example, the booster 134 may boost an 80 volt DC signal to a 170 volt DC signal. The PPS system 100 also includes an inverter microcontroller circuit 64. The inverter microcontroller circuit 64 monitors and controls the booster 134 and the inverter 44.

Each of the battery pack receptacles 24 is electrically coupled to a PPS voltage bus. The battery pack receptacles 24 are coupled to each other in series on the voltage bus. As such, when the removable battery packs 26 are coupled to the battery pack receptacles 24, the battery packs 26 are coupled in series. In other words, for example, if four 20 volt battery packs 26 are coupled to the PPS system 100, then the voltage bus is at 80 volts DC. The voltage V1 is the series voltage of the battery packs 26 coupled to the PPS system 100. In this instance V1 equals 80 volts.

The voltage bus is coupled to the booster 134. As such, the booster 134 can boost the input voltage (from the voltage bus) to the required voltage for the inverter 44, for example 170 volts DC. The inverter 44 receives the boosted DC voltage from the booster 134. In the exemplary embodiment, the inverter 44 generates a modified sign wave, as illustrate in FIG. 18.

Figure 20:
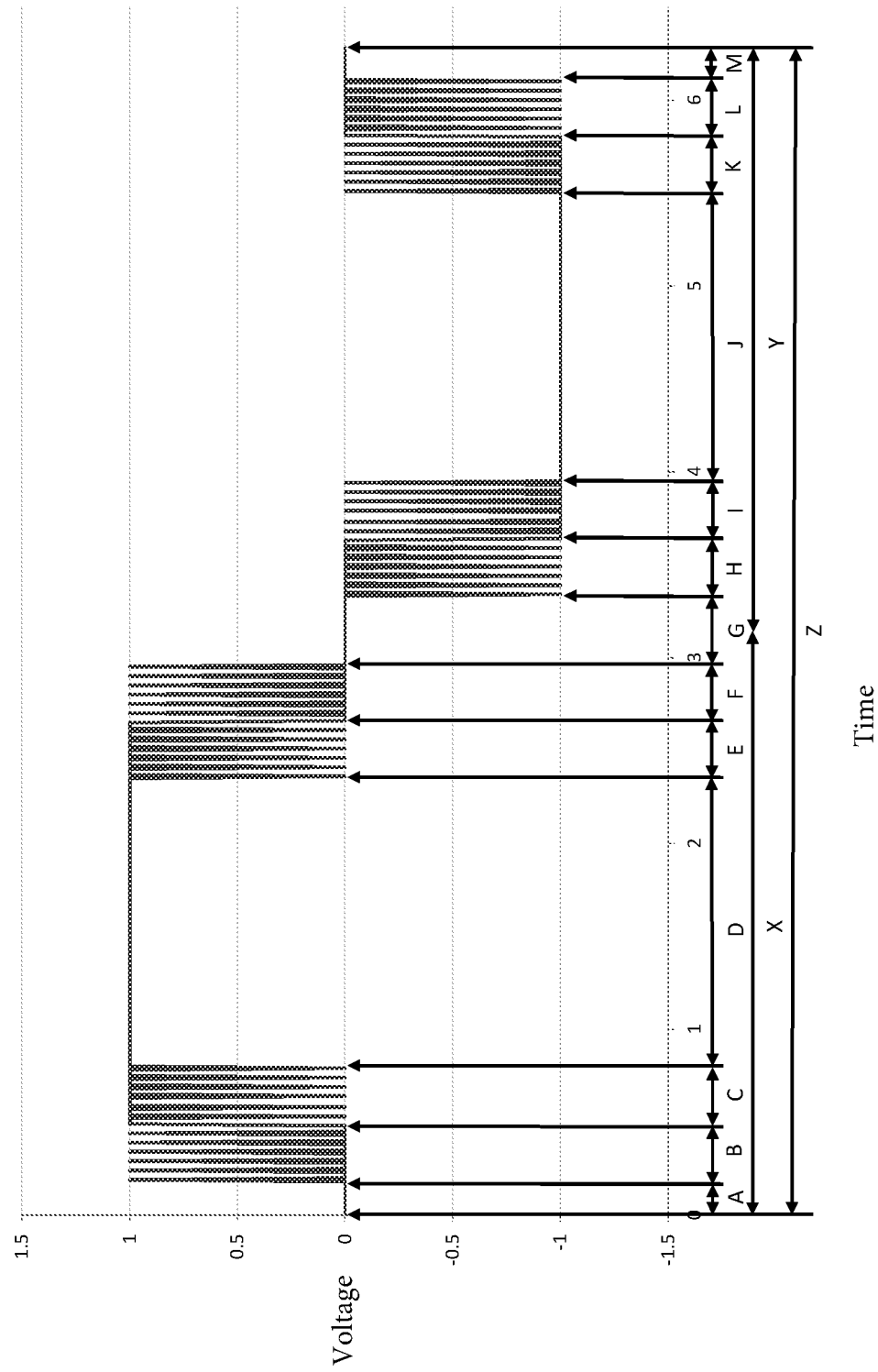
FIG. 20 is a graph illustrating an exemplary enhanced modified sine wave (PWM enhanced).

The inverter microcontroller circuit 64 provides a PWM signal to the inverter 44 to generate an enhanced modified sine wave, as illustrated in FIG. 20.

In a preferred, exemplary embodiment of an enhanced modified sine wave the inverter microcontroller circuit 64 employs PWM at 0%, 20%, 80%, and 100% to synthesize gradual transitions at highest velocity portions of the wave, while leaving the maximum possible unswitched portion (providing a good balance of wave fidelity and thermal performance).

As illustrated in the exemplary waveform of FIG. 20, the waveform produced by the inverter 44 has a period Z. During a portion A of the period Z, the inverter microcontroller circuit 64 employs a 0% PWM. During a portion B of the period Z, the inverter microcontroller circuit 64 employs a 20% PWM. During a portion C of the period Z, the inverter microcontroller circuit 64 employs an 80% PWM. During a portion D of the period Z, the inverter microcontroller circuit 64 employs a 100% PWM. During a portion E of the period Z, the inverter microcontroller circuit 64 employs an 80% PWM. During a portion F of the period Z, the inverter microcontroller circuit 64 employs a 20% PWM. During a portion G of the period Z, the inverter microcontroller circuit 64 employs a 0% PWM. During a portion H of the period Z, the inverter microcontroller circuit 64 employs a 20% PWM. During a portion I of the period Z, the inverter microcontroller circuit 64 employs an 80% PWM. During a portion J of the period Z, the inverter microcontroller circuit 64 employs a 100% PWM. During a portion K of the period Z, the inverter microcontroller circuit 64 employs an 80% PWM. During a portion L of the period Z, the inverter microcontroller circuit 64 employs a 20% PWM. And during a portion M of the period Z, the inverter microcontroller circuit 64 employs a 0% PWM.

Figure 21:
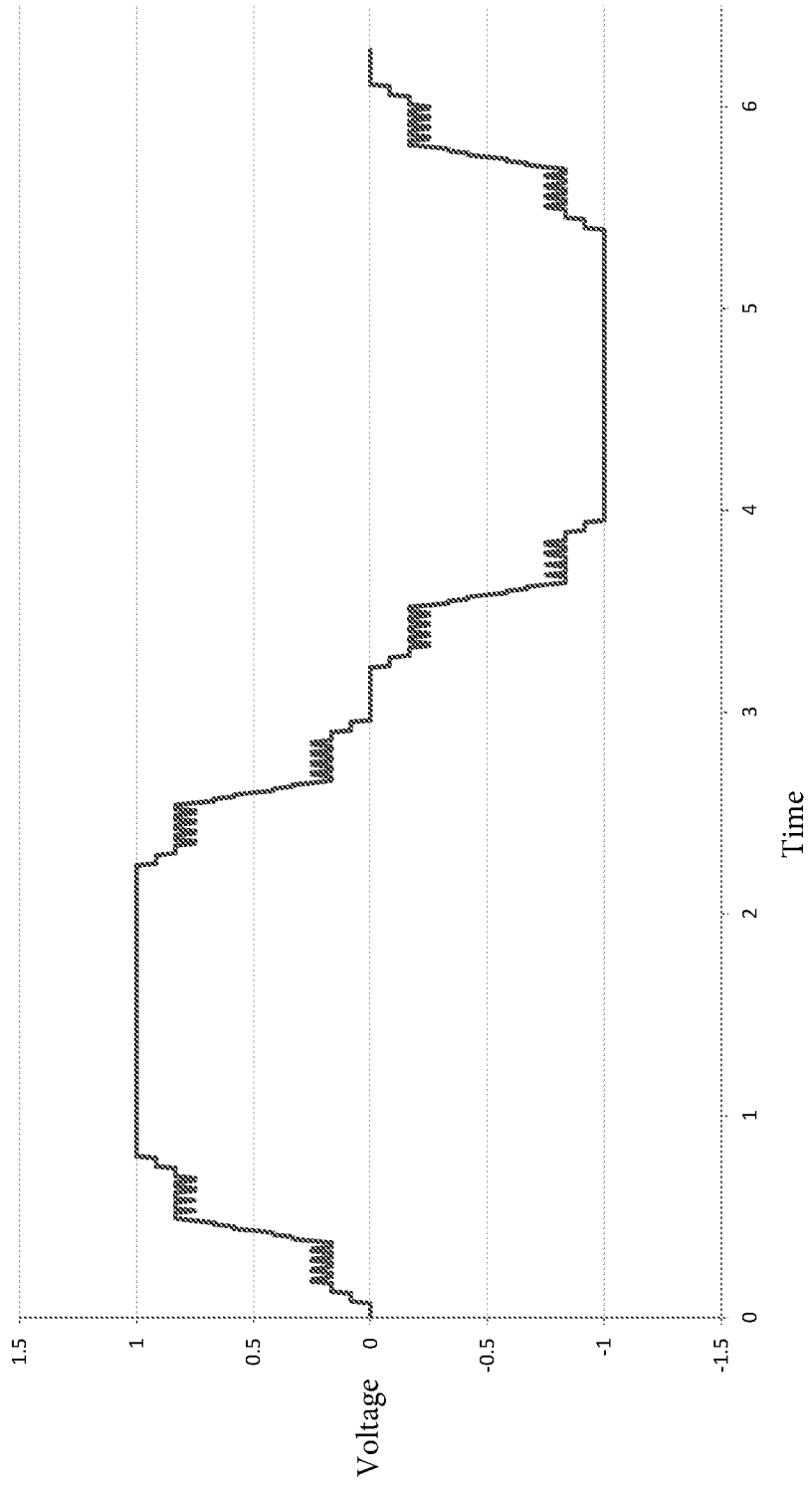
FIG. 21 is a graph illustrating an exemplary filtered enhanced modified sine wave.

The PWM waveform as seen in FIG. 20, when produced by the PPS system 100 as a whole, is subjected to a hardware output filter 138. The filter 138 effectively integrates the comparatively higher frequency components of the PWM'd waveform of FIG. 20, providing a final output waveform that effectively approximates a sine wave. A first order filtered PWM waveform can be seen in FIG. 21.

In an exemplary embodiment, the fan 56 operates as follows. If the output of the PPS system 100 is greater than 1000 watts then the fan 56 is turned ON or if the heat sink 52 temperature is greater than 42 degree Celsius then the fan 56 is turned ON.

In alternate embodiments, the inverter microcontroller circuit 64 and/or booster 134 may sense the voltage on the voltage bus (based on the number of battery packs 26 coupled to the PPS system 100) and adjust the boost of the booster 134 to achieve the voltage required by the inverter 44. For example, if there are only three 20 volt battery packs 26 coupled to the PPS system 100, the booster 134 will have to boost the voltage bus more than if there were four 20 volt battery packs 26 coupled to the PPS system 100.

The inverter 44 will begin operation when the inverter activation switch (IAS) 40 is activated by a user. The IAS 40 is coupled to the first battery pack receptacle BPR1 24*a*. If a battery pack 26 is coupled to the BPR1 24*a*, a voltage will be presented to a latch 140. The latch 140 will close the converter switch SW2. By closing the converter switch SW2, a voltage will be presented to an inverter DC-DC converter 142. The inverter DC-DC converter 142 will present a voltage to the inverter microcontroller circuit 64, thereby "waking up" the inverter microcontroller circuit 64 enabling the inverter microcontroller circuit 64 to operate. The inverter DC-DC converter 142 also presents an operation voltage to the fan 56, the booster 134 and the inverter 44. Once the inverter microcontroller circuit 64 receives the wake up voltage, the inverter microcontroller circuit 64 sends a signal to the latch 140 to keep the latch 140 closed and thereby keep the converter switch SW2 closed to maintain operation of the inverter microcontroller circuit 64. No Charge while Discharge or No Discharge while Charge In systems that include at least one charger for charging at least one battery pack—wherein the at least one charger receives charging power from an AC source—and an inverter for providing an AC output power signal derived from the at least one battery pack, it is preferred that the at least one charger and the inverter do not operate simultaneously. To this end, the instant application discloses a system that (1) prevents the charger from operating when the inverter is active and continues to operate the inverter and/or (2) disables the inverter when the inverter is active when a user attempts to use the charger and allows the charger to begin charging and/or (3) prevents the inverter from operating when the charger is active and continues to operate the charger and/or (4) disables the charger when the charger is active when a user attempts to use the inverter and allows the inverter to begin operation.

Referring to FIG. 19, as noted above, the portable power supply system 100 includes a plurality of battery pack receptacles 24 (BPR). The embodiment of FIG. 19 includes four battery pack receptacles 24*a*, 24*b*, 24*c*, 24*d*—BPR1, BPR2, BPR3, BPR4. Alternate exemplary embodiments of a portable power supply system 100 may include more or fewer battery pack receptacles 24. FIG. 19 also illustrates four removable battery packs 26*a*, 26*b*, 26*c*, 26*d*. The removable battery packs 26 are designed and configured to mechanically and electrically mate with the battery pack receptacles 24. FIG. 19 illustrates a removable battery pack 26 coupled to each battery pack receptacle 24. In practice, one or more of the battery pack receptacles 24 may be occupied by a removable battery pack 26.

The portable power supply system 100 includes at least one charger 68. In the exemplary embodiment illustrated in FIG. 19, the portable power supply system 100 includes four chargers 68*a*, 68*b*, 68*c*, 68*d*, one coupled to each battery pack receptacle 24. Alternate embodiments may include fewer chargers, either because there are fewer battery pack receptacles or such that a single charger is coupled to more than one battery pack receptacle. For example, a portable power supply system 100 having four battery pack receptacles may include two chargers such that each charger is coupled to two of the battery pack receptacles. In such an embodiment, each charger may provide a charge to its associated battery pack receptacles simultaneously or sequentially.

The portable power supply system 100 includes an AC input port ($AC_{in}$) 46 for receiving an alternating current (AC) power signal from an AC power supply. The mains line of a utility grid is an example of an AC power supply. The AC input port 46 may be a male three pronged plug. The AC input port 46 is electrically coupled to each of the chargers 68 to provide the AC power signal to each of the chargers 68 for charging a removable battery pack 26 coupled to the battery pack receptacle 24.

When a removable battery pack 26 is coupled to the battery pack receptacle 24 and the portable power supply system 100 is coupled to an AC power supply, the charger 68 associated with that battery pack receptacle 24 will provide a charging current to the coupled removable battery pack 26, assuming conditions are within predefined parameters. Each charger 68 may include a processor for implementing a charging scheme based on the type of battery pack 26 coupled to the associated battery pack receptacle 24 and the conditions of the battery pack 26, e.g., temperature, voltage level, etc. As illustrated in FIG. 19, each charger 68 includes a connection to the associated battery pack 26. This connection may allow for charging current between the charger 68 and the battery pack 26 and for communications between the charger 68 and the battery pack 26 regarding the status of the battery pack 26. The status of the battery pack 26 may affect the charging current supplied from the charger 68. A charger DC-DC converter 158 is coupled to the voltage bus and provides a wake-up voltage signal and power to the charger microcontroller circuit 152

Alternatively or additionally, a charger microcontroller circuit 152 may be coupled to each charger 68. In the illustrated embodiment, a set of charger optocouplers 154 provides information from the chargers 68 to the charger microcontroller circuit 152. The charger optocouplers 154 may relay the charge status of an associated battery pack 26 to the charger microcontroller circuit 152. This information may be used to control the individual chargers 150. This information may also be used to illuminate a set of power supply LEDs 156 to indicate the status of the battery packs 26. There may be a distinct set of LEDs 156 for each battery pack receptacle 24 or a single set of LEDs 156 for the whole portable power supply system 100.

As noted above, the portable power supply system 100 includes an inverter 44. The inverter 44 converts the direct current (DC) signal from the removable battery packs 26 into an AC signal for powering electrical devices 160, such as corded AC power tools. The inverter 44 may be any of a variety of inverters. For example, the inverter 44 may be a pure sine wave inverter. The portable power supply system 100 may also include a booster 134 for increasing the DC signal level from the battery packs 26. For example, if each of the removable battery packs 26 is a 20 volt battery pack and there are four battery packs 26 coupled to the portable power supply system 100 and the battery packs 26 are coupled to each other in series and then coupled to the booster 134, then an 80 volt DC signal (V1) is supplied to the booster 134. The booster 134 may then increase the DC signal to a 120 DC signal or a 170 volt DC signal (V2), as is needed by the particular inverter 44. The output (V3) of the inverter 44 may be provided directly to an AC output port 38 (AC$_{out}$). Alternatively, the output of the inverter 44 may be provided to a filter 138 to clean or otherwise shape the AC signal. The output (V4) of the filter 138 may then be provided to the AC output port 38. The AC output port 38 may be, for example, a female three prong electrical receptacle. The AC output port 38 may receive a plug from an electrical device 160, for example, a corded power tool or a corded appliance. The inverter 44 and the booster 132 may be controlled by an inverter microcontroller circuit 64.

In practice, the booster 134 receives the DC signal from the battery packs 26. The booster 134 generates a boosted DC signal and provides the boosted DC signal to the inverter 44. The inverter 44 receives the boosted DC signal from the booster 134 and provides an AC signal to the filter 138. The filter 138 receives the AC signal from the inverter 44 and provides a shaped AC signal to the AC output port 38. The inverter microcontroller circuit 64 is coupled to the booster 134 and to the inverter 44. The connection between the inverter microcontroller circuit 64 and the booster 134 and the inverter 44 may be a two way communication connection. This connection allows the inverter microcontroller circuit 64 to receive information from the booster 134 and inverter 44 and to provide control instructions to the booster 134 and the inverter 44.

For the inverter 44 to operate, at least one removable battery pack 26 must be coupled to the portable power supply system 100. Preferably, more than one removable battery pack 26 is coupled to the portable power supply system 100. If and how the inverter 44 is able to provide a viable AC signal to the AC output port 38 depends upon the type and number of removable battery packs 26, the booster 134 and the inverter 44. For example, a preferred portable power supply system 100 will include a booster 134 and an inverter 44 that will require at least 60 volts DC to provide a 120 volt AC signal to the AC output port 38. As such, a single 60 volt battery pack 26 could be coupled to the portable power supply system 100 or three 20 volt battery packs 26 could be coupled to the portable power supply system 100. An alternate, preferred portable power supply system 100 will include a booster 134 and an inverter 44 that will require at least 80 volts DC to provide a 120 volt AC signal to the AC output port 38. As such, four 20 volt battery packs 26 could be coupled to the portable power supply system 100.

In order to provide the AC signal to the AC output port 38, a user activates (depresses) the inverter activation switch (IAS) 40. The IAS 40 is coupled to a first battery pack receptacle 24a (BPR1). If a battery pack 26 is coupled to the BPR1 24a, an activation signal is coupled to a latch 140. The latch 140 temporarily closes a converter switch (SW2). When the converter switch SW2 is closed a power signal from the DC bus is provided to an inverter DC-DC converter 142. The inverter DC-DC converter 142 provides a DC signal to the inverter microcontroller circuit 64. This signal "wakes up" the inverter microcontroller circuit 64. Thereafter, the inverter microcontroller circuit 64 sends a signal to the latch 140 to hold the latch 140 closed, thereby maintaining a DC signal (power) to the inverter DC-DC converter 142. This allows the inverter microcontroller circuit 64, the booster 134 and the inverter 44 to continuously operate (assuming there is a sufficient charge on the removable battery packs 26 coupled to the portable power supply system 100).

As noted above, it is preferred that the charger(s) 68 and the inverter 44 do not operate simultaneously. As such, if the inverter 44 is operating as noted above and a user couples an AC power supply to the AC input port 46, the system 100 will attempt to either prevent the charger 68 from operating or stop the inverter 44 from operating.

In a first embodiment, the portable power supply system 100 will prevent the charger 68 from charging the removable battery packs 26 and continue operating the inverter 44—providing AC power to the AC output port 38.

In this embodiment, as the charger microcontroller circuit 152 is coupled to the BPR1 24a a signal is presented to the charger microcontroller circuit 152 that AC power has been coupled to the portable power supply system 100. Since the charger microcontroller circuit 152 is coupled to the inverter microcontroller circuit 64, the charger microcontroller circuit 152 is aware that the inverter 44 is operating. As such, the charger microcontroller circuit 152 sends a signal to the chargers 68, for example through the charger optocouplers 154, to prevent the chargers 68 from charging any battery pack 26 coupled to the portable power supply system 100.

In a second embodiment, the portable power supply system 100 will stop the inverter 44 from operating and allow the chargers 68 to charge any battery packs 26 coupled to the portable power supply system 100.

In this embodiment, the latch 140 is coupled to the AC input port 46. The signal from the AC input port 46 to the latch 140 directs the latch 140 to override the signal from the inverter microcontroller circuit 64 that keeps the converter switch SW2 closed and instructs the converter switch SW2 to open. As a result, the signal from the DC bus to the inverter DC-DC converter 142 is removed thereby turning off the inverter DC-DC converter 142. This in turn stops sending power to the booster 134, inverter 44 and the inverter microcontroller circuit 64. The inverter 44 will then stop operation and power will no longer be provided to the AC output port 38. This will allow the chargers 68 to charge any battery packs 26 coupled to the portable power supply system 100.

As an alternate or redundant control, the BPR1 24a is coupled to the charger microcontroller circuit 152. If the BPR1 24a receives an AC voltage signal, the charger microcontroller circuit 152 sends a control signal to the inverter microcontroller circuit 64 indicating this event. The inverter microcontroller circuit 64 then sends a control signal to the latch 140 to open the converter switch SW2. This will remove power from the inverter DC-DC converter 142 which in turn removes power from the booster 134, the inverter 44 and the inverter microcontroller circuit 64. The inverter 44 will then stop operation and power will no longer be provided to the AC output port 38. This will allow the chargers 68 to charge any battery packs 26 coupled to the portable power supply system 100.

Alternatively, if the charger 68 is operating as noted above and a user couples an AC corded device 160 to the AC output port 38, the system 100 will attempt to either prevent the inverter 44 from operating or stop the charger 68 from operating.

In a third embodiment, the portable power supply system is coupled to an AC power supply and is charging any removable battery packs 26 coupled to the portable power supply system 100 and a user attempts to operate the inverter 44 to operate a corded device 160 coupled to the portable power supply system 100 by depressing the IAS 40. In this embodiment, the portable power supply system 100 is configured to prevent the inverter 44 from operating and continue charging any battery packs 26 coupled to the portable power supply system 100. This is achieved by the latch 140 being coupled to the AC input port 46. When AC power is present at the AC input port 46, the signal to the latch 140 prevents the latch 140 from closing even though a battery pack 26 is coupled to the BPR1 24*a*. As the latch 140 does not close, the converter switch SW2 is not closed. As such, the inverter DC-DC converter 142 is not activated and a wake up voltage is not presented to the inverter microcontroller circuit 64.

In a fourth embodiment, the portable power supply system 100 is coupled to an AC power supply and is charging any removable battery packs 26 coupled to the portable power supply system 100 and a user attempts to operate the inverter 44 to operate a corded device 160 coupled to the portable power supply system 100 by depressing the IAS 40. In this embodiment, the portable power supply system 100 is configured to stop charging any battery packs 26 coupled to the portable power supply system 100 and activate the inverter 44. This is achieved by the latch 140 closing the converter switch SW2 (even though AC power is present at the AC input port 46). The inverter DC-DC converter 142 wakes up the inverter microcontroller circuit 64. Prior to the inverter microcontroller circuit 64 operating the inverter 44, the inverter microcontroller circuit 64 checks with the charger microcontroller circuit 152 to determine if the charger 68 is operating. If the charger 68 is operating but the inverter microcontroller circuit 64 is awake it indicates that the user desires to operate the inverter 44 and a corded device 160 over charging the battery packs 26. As such, the inverter microcontroller circuit 64 sends a signal to the charger microcontroller circuit 152 to shut down the chargers 68. The charger microcontroller circuit 152 then sends a signal to the chargers 68, for example through the optocouplers 154, to stop charging. Thereafter, the inverter microcontroller circuit 64 activates the inverter 44 and the booster 134 to provide an AC signal at the AC output port 38.

The invention claimed is:

1. A power supply apparatus, comprising:
a housing;
at least one battery receptacle provided on the housing for receiving at least one removable battery pack;
a modified sine wave inverter configured to convert a direct-current (DC) signal from the at least one battery pack to an alternating-current (AC) signal formed as a modified sine wave; and
a controller configured to apply a pulse-width modulation (PWM) signal to the inverter for shaping the modified sine wave, wherein for each full cycle of the modified sine wave, the controller is configured to set the duty cycle to approximately 100% within a first period corresponding to a peak area of the modified sine wave, a duration of the first period being more than half a duration of a half cycle of the modified sine wave as defined by consecutive zero-crosses of the modified sine wave, set the duty cycle to less than approximately 100% but greater than approximately 0% within a second period in which the modified sine wave transitions from the peak to a zero-cross following the first period, and set the duty cycle to approximately 0% within a third period corresponding to the zero-cross of the modified sine wave following the second period, a duration of the third period being less than approximately 10% of the duration of the half cycle of the modified sine wave.

2. A power supply apparatus comprising:
a housing;
at least one battery receptacle provided on the housing for receiving at least one removable battery pack;
a modified sine wave inverter configured to convert a direct-current (DO) signal from the at least one battery pack to an alternating current (AC) signal formed as a modified sine wave; and
a controller configured to apply a pulse width modulation (PWM) signal to the inverter for shaping the modified sine wave, wherein for each full cycle of the modified sine wave, the controller is configured to set the duty cycle to approximately 100% within a first period corresponding to a peak area of the modified sine wave, set the duty cycle to less than approximately 100% but greater than approximately 0% within a second period in which the modified sine wave transitions from the peak to a zero-cross following the first period, set the duty cycle to a greater than 50% within a first half of the second period and sets the duty cycle to less than 50% within a second half of the second period and set the duty cycle to approximately 0% within a third period corresponding to the zero-cross of the modified sine wave following the second period.

3. A power supply apparatus, comprising:
a housing;
at least one battery receptacle provided on the housing for receiving at least one removable battery pack;
a modified sine wave inverter configured to convert a direct-current (DC) signal from the at least one battery pack to an alternating current (AC) signal formed as a modified sine wave;
a controller configured to apply a pulse-width modulation (PWM) signal to the inverter for shaping the modified sine wave, wherein for each full cycle of the modified sine wave, the controller is configured to set the duty cycle to approximately 100% within a first period corresponding to a peak area of the modified sine wave, set the duty cycle to less than approximately 100% but greater san approximately 0% within a second period in which the modified sine wave transitions from the peak to a zero-cross following the first period, and set the duty cycle to approximately 0% within a third period corresponding to the zero-cross of the modified sine wave following the second period; and a filter configured to shape the modified sine wave by integrating frequency components thereof, the modified sine wave as shaped by the filter comprising, within each full cycle of the modified sine wave, a first flat portion set to a peak voltage within the first period, at least one sloped portion within the second period, and a second flat portion set to zero within the third period.

4. The power supply apparatus of claim 3, wherein the modified sine wave as shaped by the filter comprises at least two sloped portions having a flat portion therebetween within the second period.

5. The power supply apparatus of claim 1, wherein the at least one battery receptacle comprises a plurality of battery receptacles to receive a plurality of battery packs, and the power supply apparatus comprising connectivity to couple the plurality of battery packs in series.

6. The power supply apparatus of claim 5, wherein the plurality of battery packs connected in series output a total voltage of at least approximately 80 VDC.

7. The power supply apparatus of claim 1, further comprising a booster configured to boost a voltage of the DC signal from the at least one battery pack to a higher voltage level.

8. The power supply apparatus of claim 7, wherein the higher voltage level is approximately in the range of 120 VDC to 170 VDC.

9. The power supply apparatus of claim 1, further comprising an AC output port configured to output the modified sine wave to a power cord plug.

10. The power supply apparatus of claim 1, further comprising an LED indicator that is illuminated when the inverter is active.

11. A power supply apparatus, comprising:

a housing;

at least one battery receptacle provided on the housing for receiving at least one removable battery pack;

a modified sine wave inverter configured to convert a direct-current (DC) signal from the at least one battery pack to an alternating-current (AC) signal in the form of a modified sine wave;

a controller configured to apply a pulse-width modulation (PWM) signal to the inverter for shaping the modified sine wave; and a filter configured to shape the modified sine wave by integrating high frequency components thereof, wherein the modified sine wave, after modulation and filtering, comprises a first period corresponding to a peak area of the modified sine wave within which the modified sine wave is maintained at a peak voltage, a duration of the first period being more than half of a duration of a half cycle of the modified sine wave as defined between consecutive zero-crosses of the modified sine wave, a second period in which the modified sine wave is sloped to transition from the peak to a zero-cross following the first period, and a third period corresponding to the zero-cross of the modified sine wave following the second period within which the modified sine wave is maintained at zero, a duration of the third period being less than approximately 10% of the duration of the half cycle of the modified sine wave.

12. The power supply apparatus of claim 11, wherein for each full cycle of the modified sine wave, the controller is configured to set the duty cycle to approximately 100% within the first period, set the duty cycle to less than approximately 100% but greater than approximately 0% within the second period, and to 0% within the third period.

13. A power supply apparatus comprising:

a housing;

at least one battery receptacle provided on the housing for receiving at least one removable battery pack;

a modified sine wave inverter configured to convert a direct-current (DC) signal from the at least one battery pack to an alternating current (AC) signal in the form of a modified sine wave;

controller configured to apply a pulse-width modulation (PWM) signal to the inverter for shaping the modified sine wave and set the duty cycle to a greater than 50% within a first half of the second period and sets the duty cycle to less than 50% within a second half of the second period; and a filter configured to shape the modified sine wave by integrating high frequency components thereof, wherein the modified sine wave, after modulation and filtering, comprises a first period corresponding to a peak area of the modified sine wave within which the modified sine wave is maintained at a peak voltage.

14. The power supply apparatus of claim 11, wherein the at least one battery receptacle comprises a plurality of battery receptacles to receive a plurality of battery packs, and the power supply apparatus comprising connectivity to couple the plurality of battery packs in series.

15. The power supply apparatus of claim 11, further comprising a booster configured to boost a voltage of the DC signal from the at least one battery pack to a higher voltage level.

* * * * *